United States Patent [19]

Mikoshiba et al.

[11] Patent Number: 4,799,244

[45] Date of Patent: Jan. 17, 1989

[54] SURFACE ACOUSTICAL WAVE CHARGE TRANSFER DEVICE HAVING A PLURALITY OF STATIONARY CHARGE CARRIER STORAGE PORTIONS

[75] Inventors: Nobuo Mikoshiba; Kazuo Tsubouchi, both of Sendai; Makoto Nagao, Asaka, all of Japan

[73] Assignee: Fuji Photo Film Co., Ltd., Minami-ashigara, Japan

[21] Appl. No.: 880,097

[22] Filed: Jun. 30, 1986

Related U.S. Application Data

[63] Continuation of Ser. No. 226,096, Nov. 11, 1981, abandoned, which is a continuation of Ser. No. 28,879, Apr. 10, 1979, abandoned.

[30] Foreign Application Priority Data

| Apr. 14, 1978 | [JP] | Japan | 53-43642 |
| Apr. 14, 1978 | [JP] | Japan | 53-43868 |
| Oct. 25, 1978 | [JP] | Japan | 53-165010 |
| Dec. 18, 1978 | [JP] | Japan | 53-160812 |

[51] Int. Cl.$^4$ ............... G11C 19/28; H01L 29/78; H01L 27/14; H01L 31/00
[52] U.S. Cl. ........................ 377/58; 357/24; 357/30
[58] Field of Search ............... 357/24, 30; 377/57-63

[56] References Cited

U.S. PATENT DOCUMENTS

| 3,858,232 | 12/1974 | Boyle et al. | 357/24 R |
| 3,975,753 | 8/1976 | Bharat | 357/24 R |
| 3,992,716 | 11/1976 | DiStefano | 357/24 R |

FOREIGN PATENT DOCUMENTS 1009753 5/1977 Canada .................. 357/24 R

OTHER PUBLICATIONS

White, "Acoustic Surface-Wave Fields to Move Carriers in a Charge-Coupled Device", IBM Tech. Disclosure Bulletin, vol. 18 (10/75), pp. 1613-1614.
Gaalema et al, "Acoustic Surface Wave Interaction Charge-Coupled Device", Applied Physics Letters, vol. 29 (7/76), pp. 82-83.
Sequin et al, Charge Transfer Devices, Academic Press, N.Y. (1975), pp. 42-44, additional pp. 152-157.

Primary Examiner—Gene M. Munson
Attorney, Agent, or Firm—Gerald J. Ferguson, Jr.

[57] ABSTRACT

A surface acoustic wave charge transfer device of monolithic type has a channel stopper for preventing the charge carriers from deviating from the transfer channel of the device. The charge transfer device has an acoustic wave generator for generating an acoustic wave propagating in a piezo-electric layer, a transfer channel for transferring charge carriers within a depletion layer in the vicinity of the surface of a semiconductor being bunched in a potential wells of a potential wave accompanying the acoustic wave, and a detector for detecting the transferred charge carriers. In a preferred embodiment of the invention, the charge carriers are transferred in a perfect bunching condition. In another preferred embodiment, the acoustic wave propagates at such a speed that the time for propagating one wavelength distance is shorter than the statistical time for the charge carriers to drop in the traps on the surface of the semiconductor. In a further preferred embodiment, the charge transfer device has a carrier storing portion in or close to the transfer channel for storing charge carriers for memorization.

55 Claims, 10 Drawing Sheets

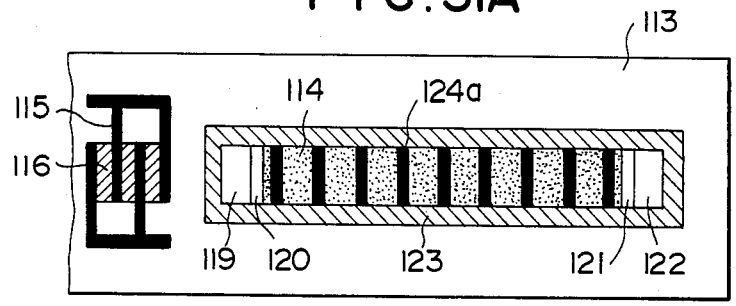
FIG.31A
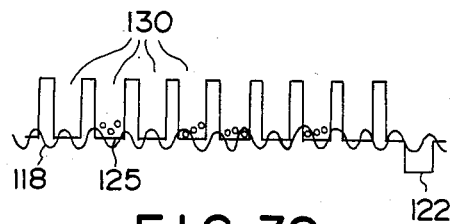
FIG.31B
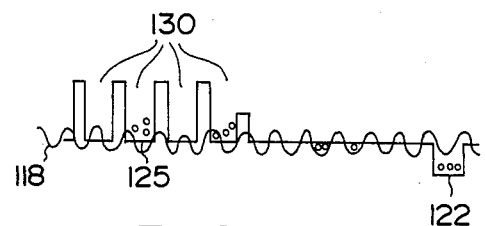
FIG.31C
FIG.32
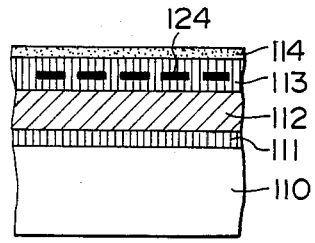
FIG.33
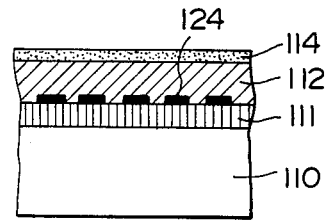
FIG.34
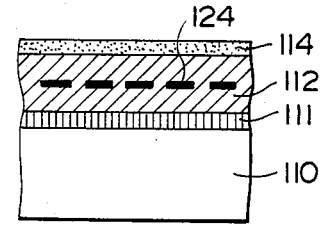
FIG.35
FIG.36
FIG.37
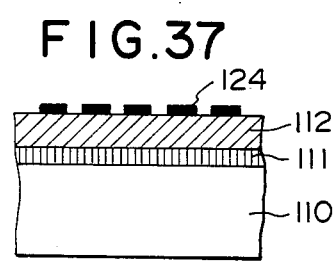
FIG.38
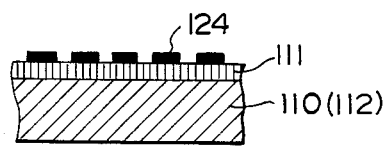

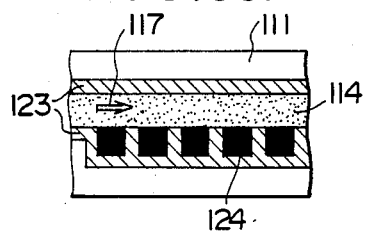
FIG.39A
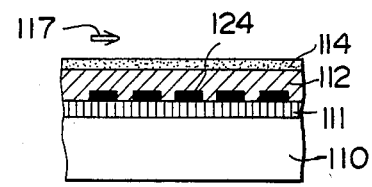
FIG.39B
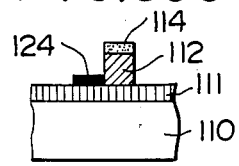
FIG.39C
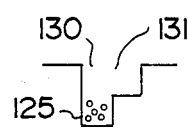
FIG.39D
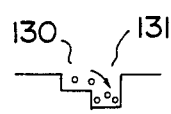
FIG.39E
FIG.39F
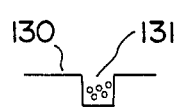
FIG.39G
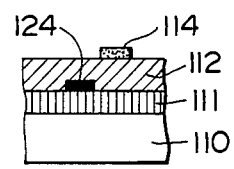
FIG.40A
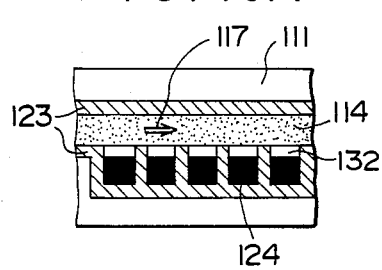
FIG.40B
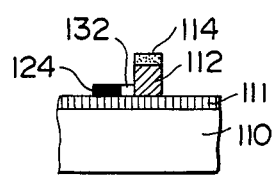
FIG.40C
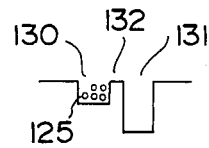
FIG.40D
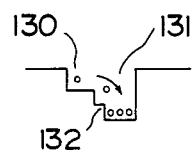
FIG.41A
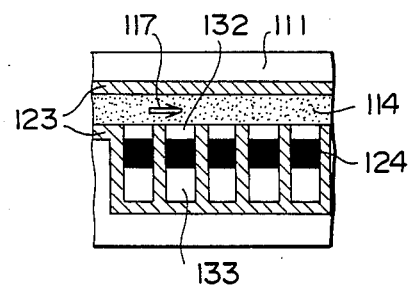
FIG.41C
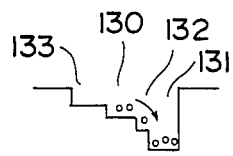
FIG.41B
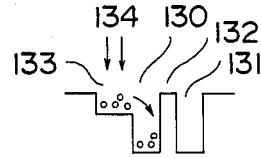

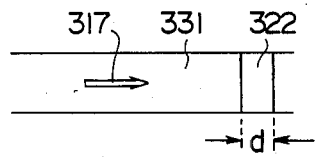
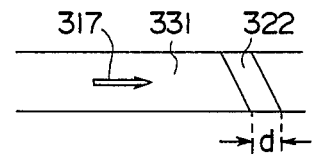
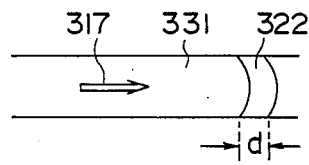
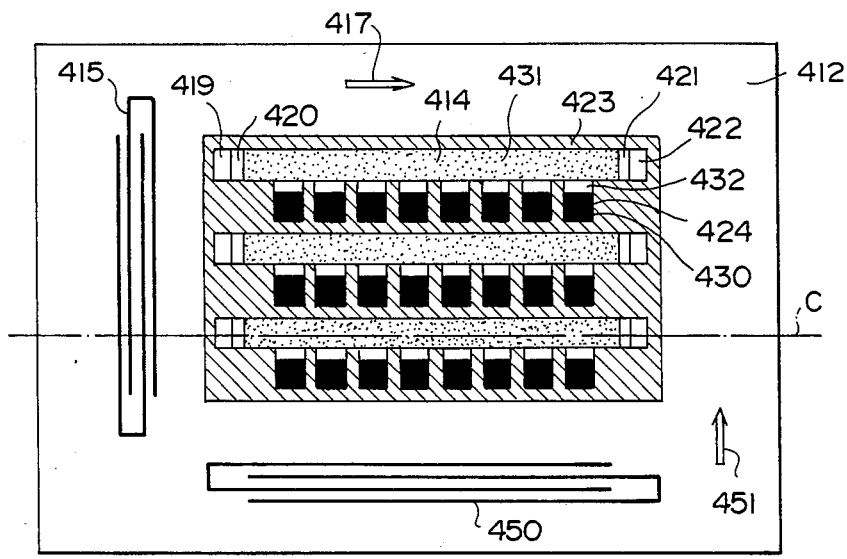
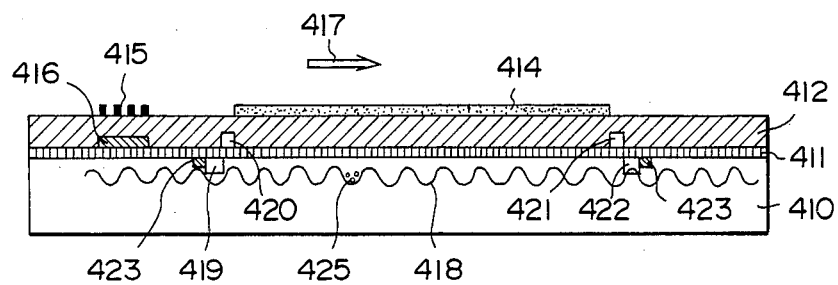

SURFACE ACOUSTICAL WAVE CHARGE TRANSFER DEVICE HAVING A PLURALITY OF STATIONARY CHARGE CARRIER STORAGE PORTIONS

This application is a continuation of Ser. No. 226,096, filed Nov. 11, 1981, now abandoned, which, in turn, is a continuation of Ser. No. 28,879, filed Apr. 10, 1979, now abandoned.

BACKGROUND OF THE INVENTION

1. Field of the Invention

This invention relates to a charge transfer device in which charge carriers are transferred in the vicinity of the surface of a semiconductor by potential wells accompanying an acoustic wave propagating in a piezo-electric material. This invention more particularly relates to a charge transfer device of monolithic type which can be used as an image information pick-up device.

2. Description of the Prior Art

There have heretofore been known various devices for transferring information. For instance, as the devices utilizing transfer of magnetic polarity are known so-called magnetic bubble devices or devices using a magnetic core with a hole in which magnetic polarity stored therein is transferred. As the devices utilizing transfer of electric charges are known, for instance, so-called BBD (bucket brigade device) in which circuits consisting of a MOSFET (metal oxide semiconductor field effect transistor) and a capacitor are integrated, and so-called CCD (charge coupled device) in which minority charge carriers are transferred along the surface of a semiconductor by use of moving potential wells created by successively applying a voltage on a series of electrodes provided on an insulating oxidized film on the semiconductor. The CCD has attracted special interest recently.

However, these devices have various drawbacks as follows. For instance, the magnetic bubble device has a long access time as long as 1 msec, and BBD has a great loss of charge carriers in transfer thereof (hereinafter referred to as "transfer loss"). The CCD is disadvantageous in that the transfer speed is limited by the diffusion speed of the charges since the potential under the transfer electrodes is flat and a part of the charge carriers move at the diffusion speed thereof. Further, CCD requires a series of electrodes for transfer and lead wires for applying voltage successively to the electrodes, and accordingly the structure is complex and hard to manufacture.

Beside the above mentioned devices, devices in which charge carriers are transferred in the vicinity of the surface of a semiconductor by use of an acoustic wave which propagates within a piezo-electric material are known in the art, which are called SAW-CTD (surface acoustic wave charge transfer device). These SAW-CTD are also disadvantageous in practical use and accordingly are not widely put into practical use. For instance, as shown in U.S. Pat. No. 3,858,232, the SAW-CTD provided with a series of metal electrodes between a semiconductor and a piezo-electric material is disadvantageous in that the potential has no gradient under the electrodes and accordingly the transfer speed is limited by the diffusion of the charge carriers per se. Further, in said U.S. patent there is shown a device in which a piezo-electric material is in direct contact with a semiconductor. Such a device has a defect in that there occurs injection or release of charge carriers between the semiconductor and the piezo-electric material and the injected charge carriers get into traps within the piezo-electric material, which results in lowering of the signal-to-noise ratio and results in hysteresis in the electric characteristics of the device. Further, another defect of the SAW-CTD is in that there is no channel stop for preventing displacement of charge carriers from charge transfer channels and accordingly a part of the charge carriers drop out of the transfer channels which results in transfer loss. Further, since there is no channel stop around the transfer channels, the transfer channels cannot be designed into non-linear form and accordingly the SAW-CTD must have an elongated shape when it is used as a delay line. Further, in Japanese Patent Publication No. 52(1977)-36677 there is disclosed a SAW-CTD in which an insulating layer is provided between a piezo-electric material and a semiconductor. This device also does not have a channel stop and accordingly has a great transfer loss and therefore is not put into practical use. In Ultrasonic Symposium Proceedings IEEE, Cat. #76, p.201-204, there is disclosed a SAW-CTD in which an insulating layer is provided on a semiconductor and a piezo-electric material is provided thereon and further thereon are disposed electrodes. This device, however, also does not have a channel stop and accordingly the transfer loss is too great. In Applied Physics Letter Vol. 29, No. 2, page 82, there is disclosed a SAW-CTD which has an air gap between a piezo-electric material and a semiconductor. This device is disadvantageous in that the electric characteristics such as electric potential are not uniform because of ununiform distribution of depletions and because the exposed surface at the air gap is liable to be electrically affected by stains or the like deposited thereon, and further in that the device is apt to be deformed because of the air gap and the output is unstable due to such defects.

As mentioned above, the conventional CCD's are impractical because of their limited transfer speed. In the conventional CCD's, the transfer frequency cannot be raised with a small transfer loss accordingly. The conventional SAW-CTD's are also impractical because of their great transfer loss and unstable electric characteristics. In addition, in the conventional SAW-CTD it is difficult to control the time of injection and amount of injection when charge carriers are injected since there is no injection gate.

Further, in case of the conventional SAW-CTD, it is impossible to store the charge carriers since the transfer of the charge carriers are caused by the potential wells moving accompanying a propagating acoustic wave. On the other hand, in the CCD the charge carriers can be stored under the electrodes when there is no movement of the potential since the transfer of the charge carriers are caused by the movement of potential between electrodes.

Furthermore, in any of the above-mentioned conventional devices, it is impossible to read out the stored information stored separately in two dimensional sense at a desired time interval.

In the SAW-CTD, the charge carriers are detected by means of a diode or the like. When the charge carriers transferred with potential wells propagating accompanying an acoustic wave are detected, the acoustic wave passing by the detection diode is detected in the form of piezo-electric potential since there is a piezoelectric material on the diode. Therefore, even where there is no signal or charge carriers trapped by the acoustic wave, the piezo-electric potential accompanying the acoustic wave is detected by the detection diode, which becomes a noise. Particularly when the amount of the charge carriers transferred is small, the noise based on the detected piezo-electric potential becomes relatively large.

Further, in the SAW-CTD used as an image pick-up device, there is a problem of blooming. That is, when the amount of the incident light is locally large, the charges in the potential well at the position of the large amount of incident light overflows into the adjacent potential wells, which results in blur of the image obtained through the device.

SUMMARY OF THE INVENTION

In view of the above mentioned various defects inherent in the conventional CCD or SAW-CTD, the primary object of the present invention is to provide a practical surface acoustic wave charge transfer device which has a very small transfer loss.

Another object of the present invention is to provide a SAW-CTD which performs stable operation.

Still another object of the present invention is to provide a SAW-CTD which has a high transfer density.

Still another object of the present invention is to provide a SAW-CTD which has a high transfer speed.

Still another object of the present invention is to provide a SAW-CTD which consumes little power.

Still another object of the present invention is to provide a SAW-CTD which has a simple structure and can be manufactured at a low cost.

A further object of the present invention is to provide a SAW-CTD which has an information storage portion and accordingly can be ued as an image pick-up device.

Still another embodiment of the present invention is to provide a SAW-CTD in which the information storage portion can freely be designed and accordingly the information storage portion can be made into fine information storage portions effecting high image resolution which is higher than that of the conventional CCD.

Still another object of the present invention is to provide a SAW-CTD which has a wide dynamic range.

Still another object of the present invention is to provide a SAW-CTD which is capable of memorizing information and in which read-out of the memorized information is possible.

A further object of the present invention is to provide a SAW-CTD in which a noise based on the acoustic wave is markedly reduced.

A still further object of the present invention is to provide a SAW-CTD in which the signal can be read out at a desired time interval and accordingly the information read out can easily be accommodated to the signal processing speed of an external processing machine.

A still further object of the present invention is to provide a SAW-CTD in which blooming is prevented.

A still another object of the present invention is to provide a SAW-CTD which can be used as a high speed memory, a high density memory, a signal processing device like a delay line, an element for a facsimile, an image pick-up device and the like.

The inventors of this invention have found three causes for the transfer loss and succeeded in markedly reducing the transfer loss by providing countermeasurements for these causes. The first cause is the deviation of the charge carriers from the transfer channels in the direction perpendicular to the direction of transfer of the charge carriers. The second cause is incomplete restraint of the charge carriers by the potential wells accompanying the acoustic wave. The third cause is trap of the charge carriers by vacant traps on the surface of a semiconductor. For the first cause, a channel stop was provided to prevent the charge carriers from deviating laterally from the transfer channels. For the second cause, the conditions of restraint of the charge carriers to prevent dropping out of the charge carriers were analyzed. The restraint of the charge carriers in the potential wells advancing accompanying an acoustic wave is called "bunching". In order to completely performing the bunching, it is desired to prepare a monolithic type device in which a piezo-electric material is integrally fixed to a semiconductor because it is able to be applied with a high potential on the surface of the semiconductor. The potential of the acoustic wave necessary for bunching can be lowered when the wavelength of the acoustic wave or ultrasonic wave is small. In case that an elastic surface wave is used as the acoustic wave, the thickness of the piezo-electric material should necessarily be smaller than the wavelength of the elastic surface wave since the potential accompanying the elastic surface wave exists in the region within about one wavelength from the surface of the device. For the third cause, the statistical time for charge carriers to drop into the trap on the surface of the semiconductor was estimated and the transfer was performed within a time shorter than the statistical time to prevent the charge carriers from dropping into the traps.

The charge transfer device in accordance with the present invention comprises an acoustic wave generating means 28 for having an acoustic wave propagate in a piezoelectric material layer 27, a transfer channel for transferring charge carriers within a depletion layer in the vicinity of the surface of a semiconductor 10 being bunched in potential wells accompanying the acoustic wave, and a detecting means 17 for detecting the transferred charge carriers, wherein the improvement which comprises a channel stopper means 24 provided for preventing the charge carriers from deviating from the transfer channel. The charge transfer device in accordance with this invention is of monolithic type. Thus, the first cause is removed.

The charge transfer device in accordance with a preferred embodiment of the present invention is charactered in that the charge carriers are transferred in the perfect bunching conditions. The second cause is removed thereby.

The charge transfer device in accordance with a further preferred embodiment of the present invention is characterized in that the acoustic wave propagates at such a speed that the time for propagating one wavelength distance is shorter than the statistical time for the charge carriers to drop in the traps on the surface of the semiconductor. The third cause is removed thereby.

The charge transfer device in accordance with another embodiment of the present invention further comprises a carrier storing portion 130, 230 provided close to or in the transfer channel.

Further, the charge transfer device in accordance with another preferred embodiment of the present invention is provided with a shift register 240 connected with the carrier storing portion 230 so that the charge carriers can be moved from the carrier storing portion to the transfer channel at a desired time interval.

The charge transfer device in accordance with another embodiment of the present invention is further characterized in that the length of the charge detecting means 322 measured in the direction of propagation of the acoustic wave is substantially an integral number of times as long as the wavelength of the acoustic wave. The "integral number of times" should be interpreted to include the approximately integral number of times which is an integral number ±1/15 times which is effective to reduce the noise.

Further, the charge transfer device in accordance with still another embodiment of the present invention further comprises, in addition to said channel stopper means 423 and said carrier storing portion 424, 430, a second acoustic wave generating means which generates an acoustic wave propagating in the direction perpendicular to said transfer channel to prevent blooming of information.

As the semiconductor to be used in this invention can be employed Si, Ge, ZnO, ZnS, CdS, Te, Se, ZnSe, InSb, InAs, InP, GaP, GaAs, GaSb, $Ga_{1-x}Al_xAs$, $GaAs_{1-x}P_x$, InGaP and so forth. The semiconductor other than the above can also be used. Among the above, particularly Si, GaAs, InAs, InSb, and CdS are preferred. Further, more than one of the semiconductors mentioned above can be used together.

As the piezo-electric material to be used in this invention can be employed ZnO, AlN, GaAs, GaP, GaSb, InAs, InP, InSb, Se, Te, CdS, ZnS, PZT system ceramics like $Pb(Sn_{0.5}Sb_{0.5})O_3PbZrO_3\text{-}PbTiO_3$, $\gamma\text{-}Bi_2O_3$ group compounds like $Bi_{12}Geo_{20}$, $Bi_{12}PbO_{19}$ and $Bi_{12}SiO_{20}$, $LiNbO_3$, $LiTaO_3$, and crystal and so forth. Other piezo-electric material can also be used. Among the above, particularly ZnO, CdS and AlN are preferred. Further, more than one piezo-electric material mentioned above can be used together.

The charge transfer device in accordance with this invention is of monolithic type. Therefore, the semiconductor 10 and the piezo-electric material 27 are fixed together into a unitary element. In fixing one to the other, an insulating layer is generally applied on a semiconductor and a piezo-electric material is applied thereon. When the piezo-electric material per se is a highly insulating material, the piezo-electric material may be directly applied on a semiconductor by a thin film forming method such as vacuum deposition, sputtering, ion plating or chemical vapor deposition.

As the insulating material to be interposed between the piezo-electric material and the semiconductor, the following material can be used for example. That is, SiO, $SiO_2$, $Al_2O_3$, $Si_3N_4$, TaN, $TiO_2$, $Ta_2O_5$, AlN, boron glass, phosphorus glass, oxygen excess polycrystalline silicon and so forth can be used therefor. Among the above materials, $Si_3N_4$, $Al_2O_3$ and $SiO_2$ are particularly preferred. Further, among these materials $SiO_2$ is most preferred. It should be noted further that more than one insulating material mentioned above may be used together.

When the semiconductor serves also as a piezoelectric material, it is unnecessary to apply the piezo-electric material on the semiconductor. In this case, only the semiconductor serving also as a piezoelectric material can solely be used. As such a material, can be used for instance CdS, ZnO, ZnS, GaAs, GaP, GaSb, InAs, InP, InSb, Se, Te and so forth.

The depletion layer in the vicinity of the surface of the semiconductor 10 means a region from which, in the p-type semiconductor for example, positive holes are moved inward from the surface of the semiconductor in response to application of a positive voltage thereon. In case of the p-type semiconductor provided with an n-type semiconductor buried on the surface thereof, the region including a part of the p-type semiconductor from which positive holes are moved away from the surface inward and the n-type semiconductor is called depletion layer in this invention. In case of an n-type semiconductor, the region from which electrons are moved away is called depletion layer.

In order to form such a depletion layer, it is possible to use ion implantation by which cations in case of p-type semiconductor or anions in case of n-type semiconductor are introduced into the layer of the insulating material applied on the semiconductor. It is also possible to form the depletion layer by applying a voltage via the insulating layer on the semiconductor. In this case, a conductor is provided on the insulating layer to form an electrode. As such a conductor can be employed a metal like Al, Au, Ag, Cr, Ni, Pt and Mo. Other metals or alloys can also be employed. Particularly, conductive material like $In_2O_3\text{-}SnO_2$ and polysylicon is preferred for this purpose. Generally, the conductive layer may be simply applied on the piezo-electric material which is directly or indirectly provided on a semiconductor. When the insulation resistance of the piezo-electric material is low, an insulating layer should preferably be superimposed between the piezo-electric material and the conductive layer. This is because the electrical characteristics in the vicinity of the surface of the semiconductor is changed if electrons or positive holes are injected into the piezo-electric material from the conductor.

As the acoustic wave generating means 28 can be used interdigital electrodes made of metal like Al or Cr, or other known methods of generating acoustic wave or ultrasonic wave. In any way, the acoustic wave generating means causes an acoustic wave to propagate through the piezoelectric material. The number of the acoustic wave generator may be more than one and the position thereof can freely be selected depending on the purpose of the charge transfer device. When interdigital electrodes are used, an acoustic wave can be generated by applying a high-frequency wave to the interdigital electrodes. In this case, a pad made of metal like Al or Cr may be provided under the interdigital electrodes in order to raise the efficiency of generation of the acoustic wave. The acoustic wave is not limited to an acoustic surface wave, and a pseudo-surface wave, boundary wave or bulk wave can be used instead thereof.

The transfer channel means a path through which charge carriers are moved. The number of the transfer channels may be one or more than one, and the shape thereof may be curved or straight, and the width thereof may be varied. Further, the transfer channels may be divided into more number of channels or may be merged into less number of channels.

The channel stopper means 24 can be made by causing a $p^+$-type semiconductor to scatter in the vicinity of the surface of a p-type semiconductor or by providing a conductor on the p-type semiconductor via an insulating layer and applying a negative voltage thereon, in case of p-type semiconductor. In case of n-type semiconductor, the similar method can be employed to provide a channel stopper means. Further, it is possible to provide a channel stopper means by making the thickness of the insulating layer small on the transfer channels and large around the transfer channels.

The detecting means 17 is a means for detecting charges in the vicinity of the surface of the semiconductor. For example, when p-Si type semiconductor is used, a diode made of p-Si and n+-Si can be used as the detection means. In practice, a detecting means consisting of a diode and a metal like Al or Au made into a gate is preferred. The detecting means is used for detecting charge carriers transferred through the transfer channels in the known method of detecting charges such as current output method, FDA (Floating Diffusion Amplifier) method, FGA (Floating Gate Amplifier) method and DFGA (Distributed Floating Gate Amplifier) method. Further, though not necessarily required in this invention, the device of this invention can be used as a delay line by providing an injecting means on the transfer channel. Such an injecting means may have the same function as that of the detecting means. Further, the injecting means may have the structure of the known charge injecting method such as DI (Dynamic Injection) method, DC (Diode Cut Off) method and PE (Potential Equilibration) method. The charge detecting or injecting means are located adjacent to the transfer channel. The charge detecting or injecting means located adjacent and lateral to the transfer channel has advantages that it does not attentuate the acoustic wave, it can easily be made into a form which guides the propagation of the acoustic wave, and it does not cause a noise to get into the signal. The charge detecting or injecting means can be located at desired position and may be of desired number. When the transfer channels are subjected to light, there are generated in the semiconductor pairs of electrons and positive holes and the minority charge carriers are transferred and detected, whereby a signal is detected. In this case, the charge injecting means is not necessary.

The perfect bunching conditions referred to in this invention means that the transfer channels are provided with a potential which is higher than the sum of the potential based on the spatial charge effected by the transferred charge carriers per se, the potential based on the diffusion effect of the transferred charge carriers, and the potential required for bunching a single charge carrier (test charge). The conditions were obtained by the inventors of this invention through a careful analysis of the characteristics of propagation of the acoustic wave in the vicinity of the surface of the semiconductor. The value of the required potential satisfying the conditions is larger than the value which was known as a potential to effect the charge transfer in the conventional SAW-CTD. (cf. IBM Technical Disclosure Bulletin Vol. 18, No. 5, page 1613-1614) In other words, by the conventionally known potential only a part of the charge carriers were transferred, but by the potential satisfying said conditions all the charge carriers are transferred. The bunching conditions can be defined, for example for the system in which a semiconductor, an insulating layer, a piezo-electric material and a metal are accumulated, as follows:

$$|\Phi| \geq \left| \left( S + \frac{D}{q\mu} \right) \left( \frac{\partial q}{\partial \theta} \right) + \frac{v\lambda}{2\pi\mu} \right| \quad (1)$$

where where $\Phi$ is a potential required for the perfect bunching, $$S = \frac{\gamma}{C_i} + \frac{2\delta}{\epsilon_p + \epsilon_s} \left( \begin{array}{l} \text{inverse number of the practical} \\ \text{capacitance sensed by acoustic wave} \end{array} \right),$$

$\gamma = 0.5$ to $1.2$ (parameter)
$C_i$ = composite capacitance of the piezo-electric layer and the insulating layer
$\delta$ = thickness of the piezo-electric layer
$\epsilon_p$ = dielectric constant of the piezo-electric material
$\epsilon_s$ = dielectric constant of the semiconductor
$D$ = diffusion coefficient of charge carriers
$q$ = amount of charge of charge carriers
$\mu$ = surface mobility of charge carriers $$\theta = 2\pi \left( \frac{x}{\lambda} - ft \right), \text{ phase angle of acoustic wave}$$

$v$ = velocity of acoustic wave
$\lambda$ = wavelength of acoustic wave
$x$ = coordinate taken in the direction of advance of wave
$f$ = frequency of acoustic wave, and
$t$ = time.

The above formula (1) is satisfied by a preferred embodiment of the present invention.

The charge transfer device in accordance with a further preferred embodiment of the present invention further satisfies a condition of $\tau_f > \tau_s$ where $\tau_f$ is the statistical time for charge carriers to drop into traps in the surface of the semiconductor and $\tau_s$ is the time for the acoustic wave to move a length of one wavelength. The statistical time $\tau_f$ can be obtained as a value which is in inverse proportion to the product of the trapping cross-section $\sigma_n$ of the surface traps of the semiconductor to the charge carriers, the number of times $1/\tau$ the charge carriers encounter the surface traps and the densitiy $n_s$ of the charge carriers. That is, the statistical time $\tau_f$ is represented by the formula $\tau_f = 1/(\sigma_n \times 1/\tau \times n_s)$.

For example, when the trapping cross-section $\sigma_n$ to the charge carriers of the surface traps for the interface of Si-SiO$_2$ is $10^{-15}$ to $10^{-18}$ cm$^{-2}$, $1/\tau$ is $(1.9 \times 10^{-13})^{-1}$ sec$^{-1}$ at a room temperature, and $n_s$ is $7 \times 10^{10}$ cm$^{-2}$, the statistical time $\tau_f$ is $2.8 \times 10^{-8}$ to $2.8 \times 10^{-6}$ sec, which means the frequency of the acoustic wave of 360 MHz to 360 KHz. The time $\tau_s$ is determined by the distance between electrodes and the piezoelectric material and the semiconductor which effect on the speed of the acoustic wave when an interdigital electrode is used as the acoustic wave generating means. For example, in the system of Si(200μ)/SiO$_2$(1000 Å)/ZnO(6000 Å), the wavelength of the acoustic wave becomes 12μ or less in order to make the frequency of the acoustic wave 360 MHz or more when the sonic speed is $4.3 \times 10^5$ cm/sec. Thus, the shape of the interdigital electrode which satisfies the above $\tau_s$ can be determined. In case of the electrode other than the interdigital electrode, the wavelength of the acoustic wave and the shape of the electrode can be determined by the similar calculation.

The charge carrier storing means 124, 114 a region of the charge transfer device where the charge carriers are prevented from being transferred restrained by the potential wells propagating accompanying an acoustic wave propagating in the transfer channel and are stored. Such a region can be msade in the transfer channel by forming a potential deeper than the sum of the potential for making a depletion in the transfer channel and the potential of the above potential wells of the propagating potential wave. Such a deep potential can be made by impressing a voltage to the depletion region of the device by applying an electrode thereon. The charge storing portion can also be made in the transfer channel by surrounding a region of the transfer channel with a potential shallower than the potential of the above potential wells of the propagating potential wave. In this case, separate electrodes are provided on the opposite sides of the surrounded region and such a voltage that will preclude existence of charge carriers which are desired to be stored in the vicinity of the surface of the semiconductor in said region is applied to the electrodes. In case that the charge storing portion is located close to the transfer channel, the charge storing portion may be a region of deeper potential than said sum of potentials or may be a region having a gate between the region and the transfer channel, said gate when closed preventing the charge carriers stored therein from diffusing into the transfer channel. The charge carrier storing portion means not only the region where the charge carriers are stored but also a photo-electric converting portion or a gate in some embodiments of this invention.

In accordance with the present invention, the SAW-CTD having an extremely small transfer loss can be made in a desired design. Further, since the wavelength of the acoustic wave can be made as short as $1\mu$, the spatial resolution can be made up to about 1/20 as compared with the conventional CCD, and accordingly the number of bits can be markedly increased.

In the embodiments described hereinbelow, the charge carriers are generated by the injecting means. However, it should be note that the charge carriers can be generated by exposing the transfer channel to light or the like and causing photo-electric conversion to occur in the transfer channel or in the storing portion.

BRIEF DESCRIPTION OF THE DRAWING

FIG. 31A is a plan view of still another embodiment of the charge transfer device in accordance with a further preferred embodiment of the present invention which has a charge carrier storing portion, FIGS. 31B and 31C are explanatory views for showing the process of storing and transferring charge carriers in the embodiment shown in FIG. 31A, FIGS. 32 to 38 are partial cross sectional views showing other embodiments of the charge transfer device having a charge carrier storing portion in accordance with this invention, FIGS. 39A and 39B are plan and cross-sectional views, respectively, of another embodiment of the present invention in which charge carrier storing portion is provided adjacent or close to the transfer channel, FIG. 39C is a side sectional view of the embodiment shown in FIGS. 39A and 39B, FIGS. 39D to 39F are explanatory views for showing the process of storing and transferring charge carriers in the embodiment shown in FIGS. 39A to 39C, FIG. 39G is a side sectional view of another embodiment similar to the embodiment shown in FIGS. 39A to 39C, FIGS. 40A and 40B are plan and sectional views, respectively, of still another embodiment of the present invention in which charge carrier storing portion is provided close to the transfer channel, FIGS. 40C and 40D are explanatory views for showing the process of storing and transferring charge carriers in the embodiment shown in FIGS. 40A and 40B, FIGS. 41A to 41C, and 42A to 42C are plan and explanatory views similar to 40A, 40C and 40D showing other embodiments of the invention, FIGS. 48A to 48C are plan views showing different examples of the charge detecting means employed in the embodiment of the present invention, FIG. 49 is a plan view of still another embodiment of the present invention which has a second acoustic wave generating means, and FIG. 50 is a cross-sectional view of the embodiment shown in FIG. 49.

DESCRIPTION OF PREFERRED EMBODIMENTS

Now the present invention will be described in detail with reference to accompanying drawings. At first, the process of manufacturing the charge transfer device of this invention will be described, and then various types of the charge transfer device will be described with reference to a number of embodiments. In the embodiments described hereinbelow, the description will be made with reference to a p-type semiconductor and electrons as charge carriers. However, it should be noted that the invention is not limited thereto but n-type semiconductors and positive holes as the charge carriers can be employed. In other words, in the embodiment described hereinbelow, it is possible to read "p" as "n", "p+" as "n+", electrons as positive holes, positive potential as negative potential and vice versa.

Figure 1:
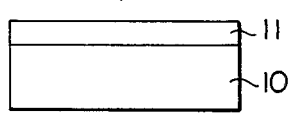
FIGS. 1 to 15 are cross-sectional views showing a process of making a charge transfer device in accordance with an embodiment of the present invention.
Figure 6:
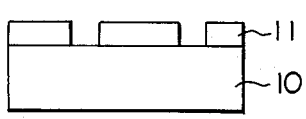
Figure 2:
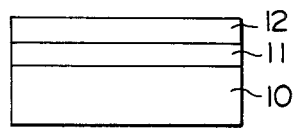
Figure 7:
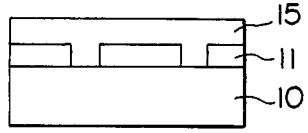
Figure 3:
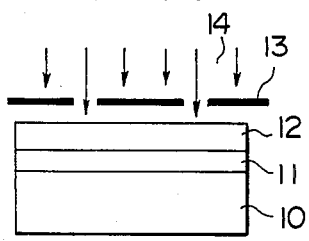
Figure 8:
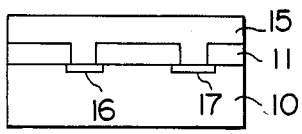
Figure 4:
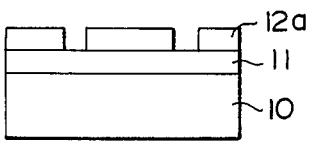
Figure 9:
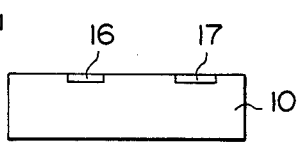
Figure 5:
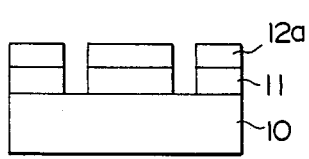
Figure 10:
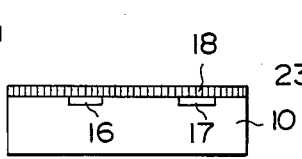

Referring to FIGS. 1 to 15, an example of a process for making a charge transfer device in accordance with the present invention will be described. A support 10 of P-Si having a thickness of about 200μ is heated in the atmosphere of oxygen of about 1200° C. for 7.5 hours by an electric furnace and the surface of the support is subjected to thermal oxidation, and a SiO2 layer 11 having a thickness of about 2500 Å is formed on the support as shown in FIG. 1. On the surface of the SiO2 layer 11 a photoresist layer 12 is applied in the thickness of about 5000 Å and then is heated at 80° C. for 25 minutes to conduct prebaking as shown in FIG. 2. A mask 13 having a transparent pattern corresponding to the charge carrier injecting portion and the charge carrier detecting portion is located above the support 10 with the SiO2 layer 11 and the photoresist layer 12 thereon is exposed to ultra-violet rays 14 as shown in FIG. 3. The photoresist layer 12 is developed to remove the exposed areas away and washed with water, and then the remaining photoresist layer 12 is heated at 80° C. for 30 min. or more to conduct postbaking of the remaining photoresist layer and obtain a resist layer 12a as shown in FIG. 4. Then, the product thus obtained is dipped in a mixture of 20 g of ammonium fluoride, 5 cc of hydrogen fluoride and 20 cc of pure water for 8 min. to conduct etching of the SiO2 layer 11 in the region exposed through removed areas of the resist layer 12a as shown in FIG. 5. Then, the product thus obtained is put into an acetone solution and subjected to ultrasonic cleaning to remove the remaining resist layer 12a as shown in FIG. 6. Further, SiO2 15 doped with phosphorus is applied thereon in the thickness of about 2000 Å and heated in an electric furnace at about 150° C. for 40 min. to conduct prebaking as shown in FIG. 7. The product thus obtained is put into an atmosphere of N2 gas of about 1200° C. for about 2 hours to cause phosphorus to diffuse into the Si support 10 at the areas where the SiO2 doped with phosphorus 15 is in contact with the support 10 to convert the areas to n+-Si to form an injecting portion 16 and a detecting portion 17 as shown in FIG. 8. The SiO2 layer 11 is then removed by etching to expose the surface of the Si support 10 as shown in FIG. 9. Then the surface of the exposed support 10 is heated at about 1050° C. for about 2.5 hours to form a SiO2 layer 18 having a thickness of about 1000 Å thereon as an insulating layer as shown in FIG. 10.

Figure 11:
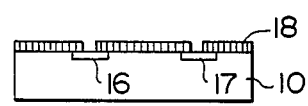
Figure 12:
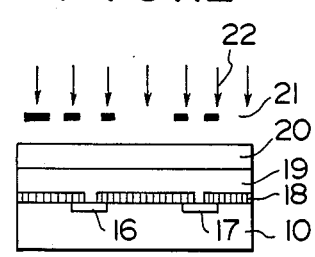

Then, on the surface of the product thus obtained is applied a photoresist layer, and the layer is prebaked and exposed to ultra-violet rays through a mask having transparent portions above the injecting portion 16 and the detecting portion 17 having smaller areas than the portions 16 and 17, and is postbaked. Then, the SiO2 layer 18 is removed by etching and the resist layer is removed in the manner similar to said process whereby a product having an insulating layer 18 of SiO2 having through-holes on the injecting portion 16 and the detecting portion 17 is obtained as shown in FIG. 11. Further, on the surface of the product thus obtained is deposited Al layer 10 by vacuum deposition and a photoresist layer 20 is applied thereon and prebaked. Then, the photoresist layer 20 is exposed to ultra-violet rays 22 through a mask 21 having a pattern of opaque portions corresponding to the injecting portion 16, the detecting portion 17, wiring patterns therefor, a channel stopper and the wiring pattern therefor, an injection gate and the wiring pattern therefor, a detection gate and the wiring pattern therefor, and a pattern of a pad to be provided under the later-mentioned interdigital electrode as shown in FIG. 12. After developing and washing the resist layer having said pattern is formed, and the exposed Al layer 19 is etched by use of a mixture solution of phosphoric acid and nitric acid and the resist layer is removed.

Figure 13:
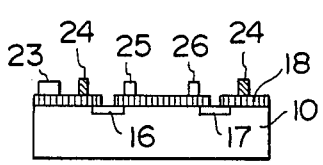
Figure 14:
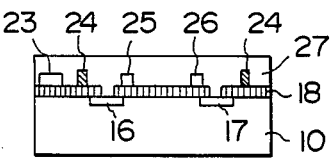
Figure 15:
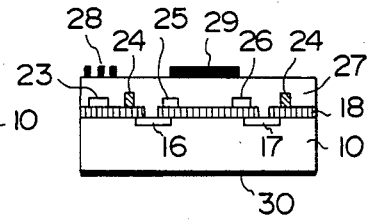

In FIG. 13, a pad 23, channel stoppers 24, an injection gate 25 and a detection gate 26 are shown. The Al layer of the wiring is omitted. On the product thus obtained as shown in FIG. 13, a layer of ZnO 27 is applied in the thickness of about 0.6μ as a piezoelectric material by sputtering as shown in FIG. 14. Then, an interdigital electrode 28 having a width and interval of 3μ and an electrode 29 of Al for making a depletion layer are formed on the ZnO layer 27 by a lift-off method. Further, on the back surface of the support 10 is vacuum deposited Au 30 as shown in FIG. 15.

Figure 16A:
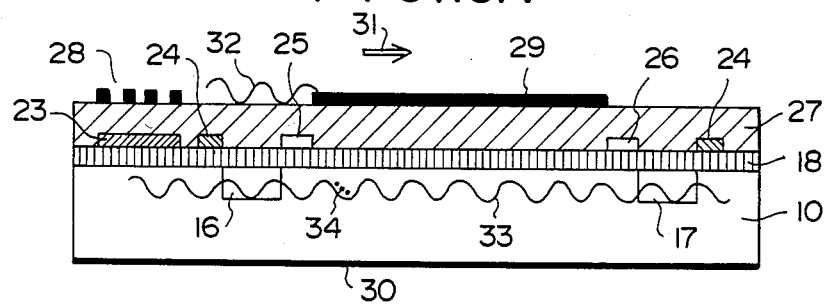
FIGS. 16A and 16B are cross-sectional view and plan view, respectively, of an embodiment of the charge transfer device in accordance with the present invention.
Figure 16B:
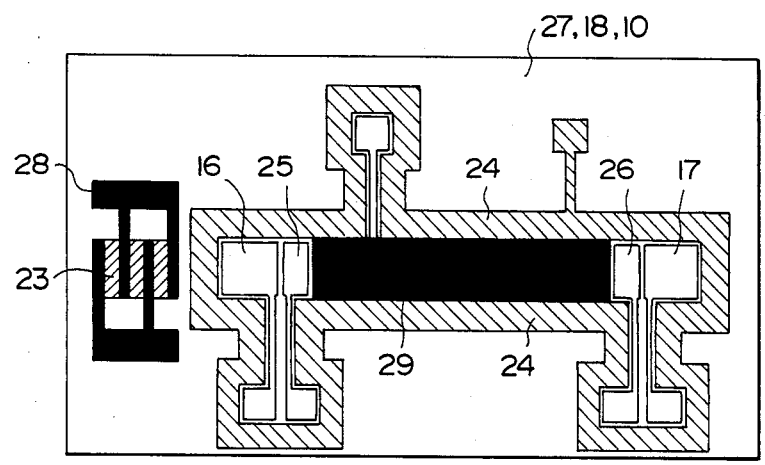

FIG. 16A shows an enlarged cross-sectional view taken along the transfer channel of an embodiment of the charge transfer device in accordance with this invention, and FIG. 16B shows the plan view thereof in which even the structure invisible due to the accumulated layers is illustrated to show the relative position of various elements with others. In FIG. 16B various terminals are shown connected with injection gate 25 and the like positioned outside a transfer channel. The shape and the size of such terminals may properly be changed. The size of the terminals and other elements shown in FIGS. 16A and 16B is exaggerated to facilitate understanding of the structure thereof. Further, devices for impressing voltage to these terminals are omitted from the drawing.

In this charge transfer device, a high-frequency wave voltage is applied to the interdigital electrode 28 to generate an elastic surface wave on the piezo-electric layer 27. Here, the elastic surface wave 32 advancing in the direction of the arrow 31 is utilized for transferring charges. The reference character 33 designates a potential wave accompanying the surface wave 32 and advancing in the direction of the arrow 31. In order to transfer charge carriers, for example +10 V is applied to the conductor 29 made of Al to deplete the surface of the semiconductor 10, 0.1 V is applied to the injecting portion (injection diode) 16, 1.0 V to the injection gate 25, 0.5 V to the detecting portion (detection diode) 17, 1.5 V to the detection gate 26, and −10 V is applied to the channel stopper 24. Prior to the injection of the charge carriers into the injecting portion 16, the elastic surface wave is generated and the charge carriers existing in the vicinity of the surface of the semiconductor are restrained in the potential wells of a potential wave accompanying the elastic surface wave and transferred away thereby. Then, when charge carriers 34 are injected into the depletion layer in the vicinity of the surface of the semiconductor by opening the injection gate 25 at the injecting portion 16, the charge carriers 34 are restrained in the potential wave 33 and transferred through the transfer channel in the form of a depletion layer surrounded by the channel stopper 24 and are detected at the detecting portion 17 by opening the detection gate 26.

In the above example, the specific resistance of the support Si 10 is 130 $\Omega$cm and the thickness of the ZnO layer 27 is 0.6$\mu$ and the wavelength of the elastic surface wave is 12$\mu$. Further, the potential of 30 mW which is sufficient for satisfying the bunching conditions for the density of charge carriers to be transferred of $10^{10}/cm^2$ is kept being applied to the end of the transfer channel by generating such a high power acoustic wave. The statistical time $\tau_f$ for the charge carriers to drop into the surface traps of the semiconductor of the charge transfer device is as hereinbefore mentioned, and the distance of advancement of the acoustic wave in such a time is about 12$\mu$. Therefore, there is almost no transfer loss due to trapping in the charge transfer device in accordance with the above mentioned embodiment of the present invention.

Figure 17A:
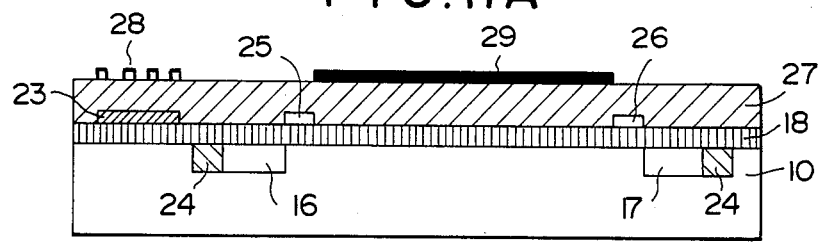
FIGS. 17A and 17B are similar views of another embodiment of the present invention.
Figure 17B:
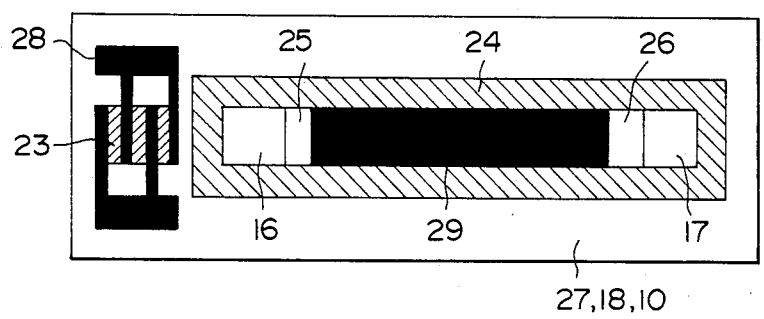

FIGS. 17A and 17B show another embodiment of the charge transfer device in accordance with the present invention. In this embodiment, a channel stopper 24 is provided within the semiconductor 10. The channel stopper 24 is, for instance, $p^+$-Si diffused around the transfer channel in the p-Si semiconductor 10. Such a channel stopper can be made by thermal diffusion or ion implantation. In case of this embodiment, the structure is simpler than the aforesaid embodiment and the channel stopper 24 has a greater effect than said embodiment since the channel stopper prevents charge carriers from diffusing away without the intervention of the insulating layer 18.

Figure 18:
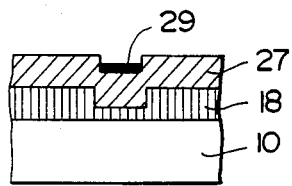
FIG. 18 is a side sectional view showing still another embodiment of the charge transfer device of this invention.

The structure of the channel stopper may be of the cross-section as shown in FIG. 18. The channel stopper shown in FIG. 18 is characterized in that the thickness of the insulating layer 18 outside the transfer channel is increased. Even if the width of the conductor 29 is larger than that of the transfer channel, the influence of an electric field is reduced outside the transfer channel owing to the thick insulating layer 18 and accordingly the charge carriers are prevented from getting out of the transfer channel by the potential shallower than the potential within the transfer channel. Such an insulating layer 18 can be made by first forming an insulating layer of uniform thickness by thermal oxidization on the support 10 and etching the transfer channel portion and again forming generally an insulating layer thereon by thermal oxidization.

Figure 19:
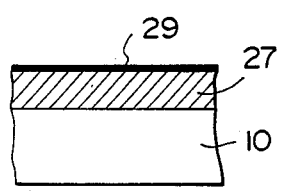
FIGS. 19 to 21 are sectional views showing other embodiments of the charge transfer device of this invention.

In case that the piezo-electric material has high insulation like AlN, the cross-section of the transfer channel of the charge transfer device of this invention may be as shown in FIG. 19 in which an insulating layer is removed. In this case, the channel stopper may be provided in the piezo-electric layer 27 as the embodiment shown in FIG. 16A or in the semiconductor layer 10 as the embodiment shown in FIG. 17A. This embodiment is advantageous in that the structure of the device is simple without an insulating layer and accordingly the manufacture thereof is also simple. As the piezo-electric material to be used for this purpose should preferably have specific resistance of $10^{10}$ $\Omega$cm or more.

Figure 20:
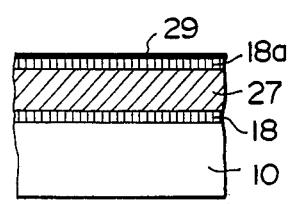

In case that the piezo-electric material has low insulation of $10^{10}$ $\Omega$cm or less like Cds, the cross-section of the transfer channel of the charge transfer device of this invention is desired to have insulating layers 18 and 18a on both surfaces of the piezo-electric layer 27 as shown in FIG. 20. With such an arrangement, it is possible to make a charge transfer device using a piezo-electric material having low insulation.

Figure 21:
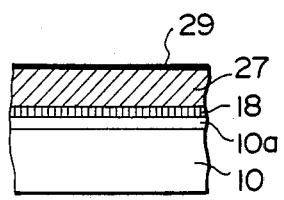

FIG. 21 shows another embodiment in which $n^+$-Si layer 10a is provided on the surface of the p-Si layer 10. In such a structure, the mobility of the charge carriers is so high that the bunching potential of the acoustic wave can be made small. Further, since the charge carriers move in the region separated from the surface of the semi-conductor where the trap density is lower than the surface, the transfer loss of the charge carriers due to trapping is small. The structure of the piezo-electric layer 27 and the insulating layer 18 is not limited to the one shown in FIG. 21.

Figure 22A:
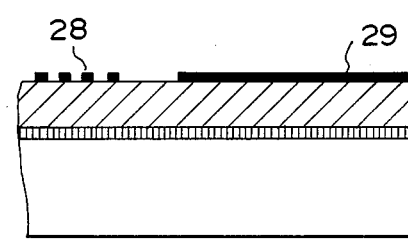
FIG. 22A is a cross-sectional view of another embodiment of the charge transfer device of this invention.
Figure 22B:
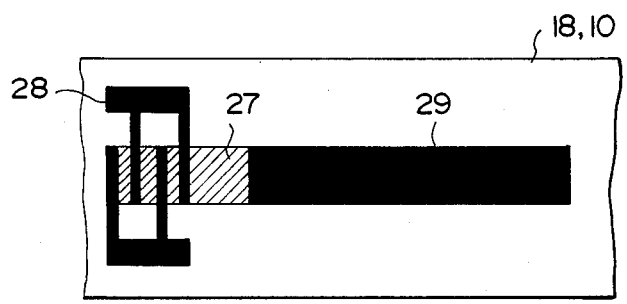
FIG. 22B is a plan view of the embodiment shown in FIG. 22A.
Figure 22C:
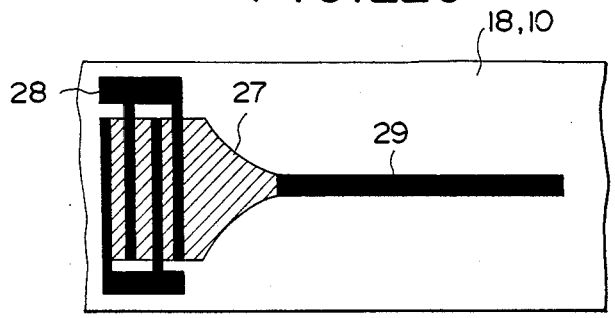
FIG. 22C is a plan view of another embodiment having a cross-section as shown in FIG. 22A, FIGS. 23, 24, 25A, 25B and 26 are plan views of other embodiments of the charge transfer device of this invention.

As shown in FIGS. 22A and 22B, the piezo-electric layer 27 may not be provided over the whole area of the insulating layer 18 but may be provided only on the transfer channel of the charge carriers. Further, as shown in FIG. 22C (the plan view thereof being for example as shown in FIG. 22A), the piezo-electric layer 27 can be of such a shape that the acoustic wave is restrained within the piezo-electric layer 27 provided only on the transfer channel and a higher potential can be generated within the transfer channel in the semiconductor.

Figure 23:
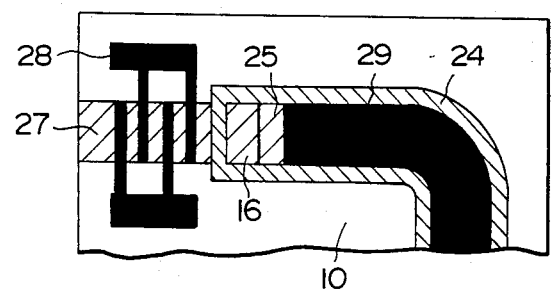

As shown in FIG. 23, the transfer channel may be curved. In this case, the piezo-electric layer should preferably be provided on the transfer channel and the channel stopper should preferably be provided there-around. The transfer channel may not have a uniform width through its length. When the width of the transfer channel is changed, the charge carriers transferred are dispersed or concentrated at the position where the width of the transfer channel is enlarged or reduced. Further, the transfer channel may be divided into several branches or may be merged with other channel branches.

Figure 24:
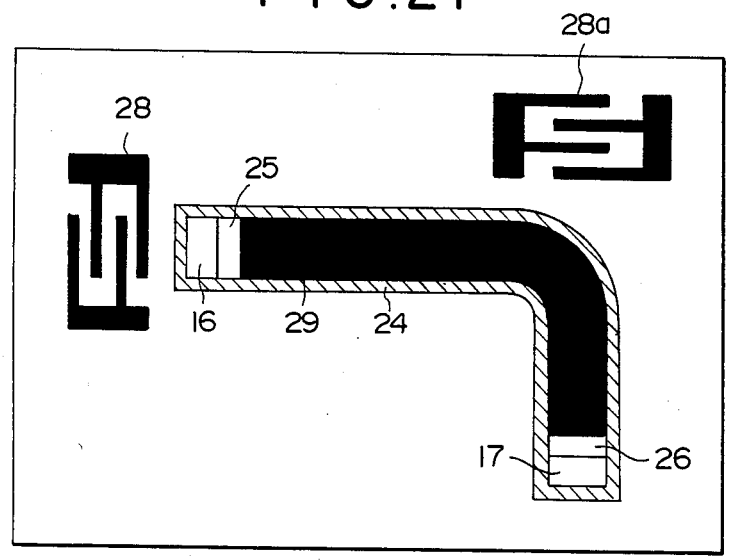

When the transfer channel 29 is curved as shown in FIG. 24, there may be provided an additional interdigital electrode 28a beside the first interdigital electrode 28 in order that not only the charge carriers are injected into the transfer channel 29 through the injecting portion 16 and transferred straight forward therefrom, but also the charge carriers are effectively transferred along and downstream the curved portion of the transfer channel.

Figure 25A:
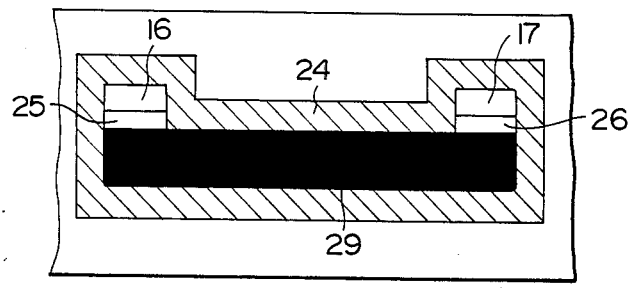

FIG. 25A shows an embodiment in which an injecting portion 16 and a detecting portion 17 are provided beside the transfer channel 29 via an injection gate 25 and a detection gate 26. The position and number of the injecting and detecting portions 16 and 17 can be freely selected as desired. The injecting and detecting portions 16 and 17 may of course be provided also at the both ends of the transfer channel 29. When the injecting or detecting portion is provided beside the transfer channel, the acoustic wave is not attenuated thereby. Further, the noise caused by a piezo-electric potential at the detecting portion is reduced by providing the detecting portion beside the channel.

Figure 25B:
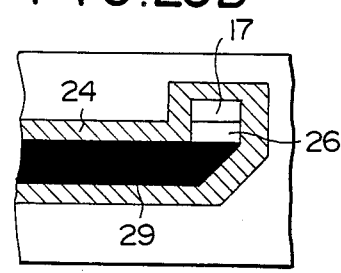

As shown in FIG. 25B, it is desirable to make the width of the transfer channel 29 small at the end of the channel to effectively have the charge carriers detected.

Figure 26:
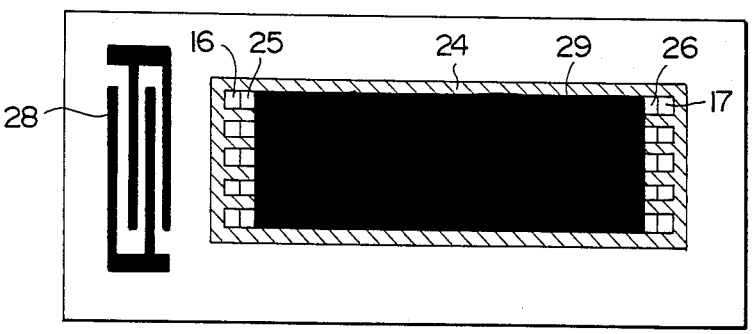

As shown in FIG. 26, there may be provided a plurality of transfer channels in parallel to each other. In the illustrated embodiment, five transfer channels are provided in parallel to each other. The number of the transfer channels can freely be selected as desired. The transfer channels are defined from each other by means of channel stoppers. The channel stoppers may not be provided in parallel to each other and may not be straight as shown but may be of any shape as desired.

Figure 27:
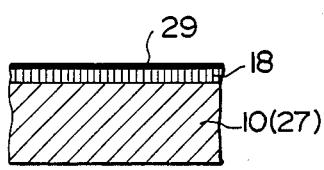
FIGS. 27 to 29 are cross-sectional views of still other embodiments of the charge transfer device in accordance with this invention.

As shown in FIG. 27, when the semiconductor 10 is a piezo-electric material 27, an insulating layer 18 is provided on the semiconductor (piezo-electric material) 10 (27) and further thereon a conductor 29 is provided.

Figure 28:
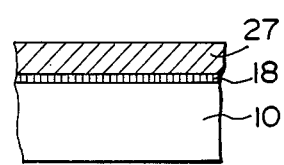

As hown in FIG. 28, by implantation of ions into the insulating layer 18 or the piezo-electric layer 27, the region in the vicinity of the surface of the semiconductor 10 can be depleted. For instance, when a p-type semiconductor is used, cations are implanted into the surface of the insulating layer 18 or the piezo-electric layer 27.

Figure 29:
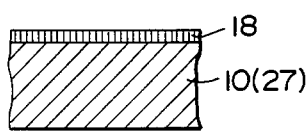

As shown in FIG. 29, when the semiconductor 10 is also a piezo-electric material 27, it is possible to implant ions into the insulating layer 18 thereon to deplete a region in the semiconductor 10 close to the insulating layer 18. In this case, the structure of the device can be made very simple.

Now the invention will be described with reference to other embodiments which are provided with a charge carrier storing portion and accordingly can be used as an image pick-up device. At first, embodiments with a charge carrier storing portion within the transfer channel will be described. Further, the embodiments will be described mainly with the examples in which the semiconductor is of p-type and the charge carriers are electrons, but it should be noted that the invention is not limited thereto. For instance, the invention can be applied to a device using an n-type semiconductor in which the charge carriers are positive holes. In such a case, similarly to the foregoing embodiments, "p" and "p$^{30}$" should be read as "n" and "n$^+$" and electrons as positive holes and the positive potential should be read as a negative potential and vice versa.

Figure 30A:
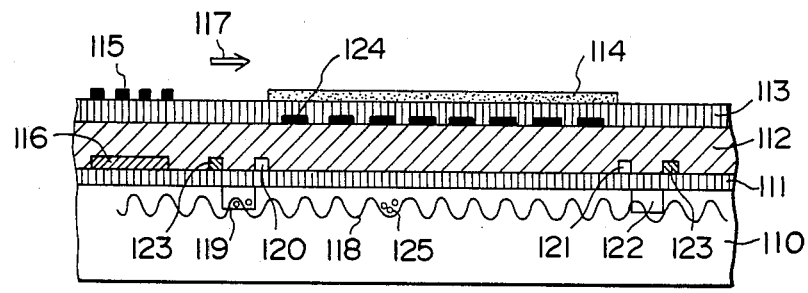
FIGS. 30A and 30B are cross-sectional and plan views respectively, of still another embodiment of the charge transfer device in accordance with a further preferred embodiment of the present invention which has a charge carrier storing portion.
Figure 30B:
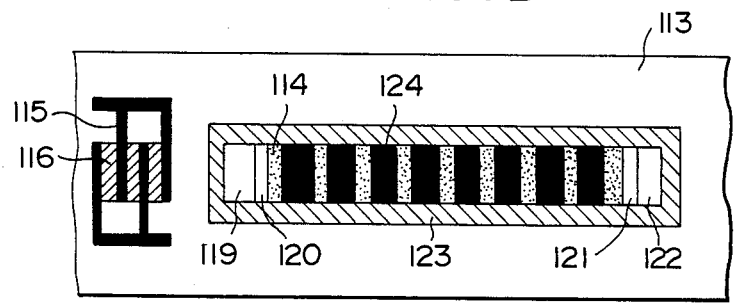

FIGA. 30A and 30B show an embodiment of the present invention in which a charge carrier storing portion is provided in the transfer channel. FIG. 30A is a longitudinal cross-sectional view and FIG. 30B is a plan view of the embodiment. A semiconductor 110, an insulating layer 11, a piezo-electric layer 112, another insulating layer 113 and a conductive layer 114 are accumulated in this order. The conductive layer 114 is not provided over the whole area of the insulating layer 113. An interdigital electrode 115 is provided on the insulating layer 113 apart from the conductive layer 114, and a pad 116 is provided under the interdigital electrode 115 in the piezo-electric layer 112 The conductive layer 114 is located above a transfer channel and is applied with a voltage for deplete the semiconductor 110 at its upper area in the vicinity of the surface thereof.

The pad 116 is provided for the purpose of effectively generating an acoustic wave in the piezo-electric layer 112 when a high frequency voltage is applied to the interdigital electrode 115. In response to application of a high frequency voltage to the interdigital electrode 115, an acoustic wave propagates in the direction of the transfer indicated by an arrow 117 and a potential wave 118 accompanying the propagation of the acoustic wave also propagates in the same direction. An injection diode 119 is provided in the semiconductor 110 at the surface thereof, an injection gate 120 is provided in the piezo-electric layer 112 adjacent to the injection diode 119, a detection gate 121 is provided in the piezo-electric layer 112 at the end of a transfer channel formed under the conductive layer 114, a detection diode 122 is provided in the semiconductor 110 adjacent to the detection gate 121, and a channel stopper 123 is provided around the transfer channel surrounding the transfer channel and the injection diode 119 and the detection diode 122. The channel stopper 123 may be provided in the semiconductor 110 though in the illustrated embodiment the channel stopper 123 is provided in the piezo-electric layer 112.

In the above described embodiment, the charge carriers are transferred in the direction of the arrow 117 in the same manner as in the aforementioned embodiments having no charge carrier storing portion as shown in FIGS. 16A and 16B. The transferred charge carriers are detected by the detection diode 122 by opening the detection gate 121.

Figure 30C:
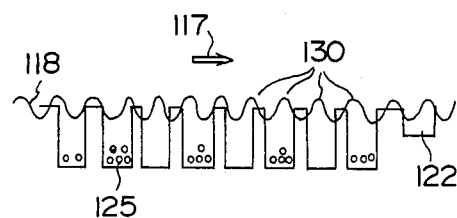
FIGS. 30C and 30D are explanatory views for showing the process of storing and transferring charge carriers in the embodiment shown in FIGS. 30A and 30B.
Figure 30D:
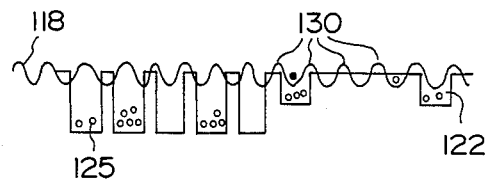

Now the charge carrier storing portion will be described in detail referring to FIGS. 30A to 30D. A series of electrodes 124 are provided in the upper insulating layer 113 on the piezo-electric layer 112 being separated from the conductive layer 114 to form potential wells in the vicinity of the surface of the semiconductor 110 thereunder. The potential wells of deep potential created by the electrodes 124 constitute a charge carrier storing portion 130 consisting of a number of sections as shown in FIGS. 30C and 30D. As shown in FIG. 30C, in some of the sections of the charge carrier storing portion 130, charge carriers 125 are stored and are not transferred by the potential wave 118. In FIGS. 30C and 30D, the level of the potential is represented by the height or depth of the potential wells vertically illustrated. Where the level of the potential is high, the charge carriers 125 stored in the potential wells or sections of the storing portion 130 are not transferred by the potential wave 118. The charge carriers 125 are restrained in the deep potential wells in the storing portion 130 and accordingly cannot get on the potential wave 118 of shallow potential. In this case, the depth of the potential applied to the series of electrodes 124 is greater than the sum of the potential for forming the depletion layer in the semiconductor 110 and the potential of the potential wave 118.

The charge carriers 125 stored in the storing portion 130 like this may be ones generated from the injection gate 120 and restrained thereby or may be electrons generated within the semiconductor 110 by the effect of light impinging thereon. In order to store the charge carriers 125 transferred through the transfer channel in the storing portion 130, the potential of the storing portion 130 is made gradually deeper in the direction opposite to the direction of advancement of the potential wave 118 indicated by the arrow 117, for example. FIG. 30D shows the process of successively transferring the charge carriers 125 from one section to another in the charge carrier storing portion 130. By successively releasing the application of voltage to the series of electrodes 124 in the direction opposite to the direction of propagation of the potential wave 118, the level of the potential of the potential wells of the storing portion 130 is changed as shown in FIG. 30D and the charge carriers 125 restrained in the storing portion 130 are restrained by the potential wells of the potential wave 118 and consequently transferred. By selecting the time interval of the application of voltage properly, the charge carriers 125 are transferred at a time interval corresponding to the position of the storing portion 130 and are detected by the detecting diode 122 at the same time interval. Accordingly, it can be known in which storing sections the charge carriers 125 have been stored. When the spatial interval of the sections of the storing portion 130 is larger than the wavelength of the potential wave 118, the position of the charge carriers or in which sections the charge carriers 125 have been stored can be known even if the charge carriers are taken by the potential wave at the same time from all the sections of the storing portion 130. In case that the charge carriers are transferred by the potential wave, it is unnecessary to restrain the information stored in the storing portion in only one wavelength of the potential wave. Therefore, the charge carriers can be transferred by several potential wells. Consequently, the dynamic range of the signal can be made large. Further, the transfer loss is reduced since the charge carriers are not left in the storing portion.

FIG. 31A shows another embodiment of the charge transfer device which has a charge carrier storing portion in the transfer channel. This embodiment is different from the previous embodiment shown in FIGS. 30A and 30B in the position and size of the series of electrodes. In this embodiment, the series of electrodes 124a are small in the direction of transfer and the storing sections constituting the storing portion 130 is formed between the adjacent electrodes 124a whereas in the foregoing embodiment the storing sections are formed under the electrodes 124. The mechanism of storing and transferring charge carriers is shown in FIGS. 31B and 31C. When the level of the potential wells is high as shown in FIG. 31B, the charge carriers 125 stored in the storing sections are not transferred. In order to transfer the charge carriers 125, the level of the potential wells is changed as shown in FIG. 31C in the similar manner to that shown in FIG. 30D.

Other embodiments of the charge transfer device which has the storing portion in the transfer channel are shown in FIGS. 32 to 38 and will be described referring thereto. In the following embodiments, the series of electrodes may be of the type as shown in FIGS. 30A and 30B or the type as shown in FIG. 31A.

The embodiment shown in FIG. 32 has a series of electrodes 124 within the insulating layer 113. When the piezo-electric layer 12 is comparatively low insulation, this structure is desirable. As an example of the piezo-electric material of this type are known CdS or the like having specific resistance of $10^{10}$ $\Omega$cm or less.

The embodiment shown in FIG. 33 has a series of electrodes 124 directly on the insulating layer 111 in the piezo-electric layer 112. This structure is possible when the piezo-electric layer 112 has high insulation. Since the structure is simple, the manufacture thereof is also simple.

The embodiment shown in FIG. 34 has a series of electrodes 124 within the piezo-electric layer 112. The embodiment shown in FIG. 35 also has a series of electrodes 124 within the piezo-electric layer 112. These structures are also possible when the piezo-electric layer 112 has high insulation. These embodiments are advantageous in that the number of layers can be reduced and accordingly the manufacture thereof is simple. As the piezo-electric material for these embodiments can be used AlN for instance.

FIG. 36 shows another embodiment in which two semiconductors are combined. For instance, an n+-Si layer 10a is provided on a p-Si layer 10. This embodiment is advantageous in that the mobility of the charge carriers is high and the transfer loss is small.

The embodiment shown in FIG. 37 has a depletion region in the vicinity of the surface of the semiconductor 10 by implantation of ions into the insulating layer 111 or the piezo-electric layer 112. When a p-type (n-type) semiconductor 110 is used, cations (anions) are implanted into the surface of the insulating layer 111 or the piezo-electric layer 112.

The embodiment shown in FIG. 38 has a depletion region in the surface of the semiconductor 110 which is also a piezo-electric material 112 by implantation of ions into the insulating layer 111.

Now other embodiments of the charge transfer device of this invention having a charge carrier storing portion beside or close to the transfer channel will be described hereinbelow.

In the embodiment shown in FIGS. 10A to 10C, a series of electrodes 124 are located beside the piezo-electric layer 112 and the conductive layer 114. The series of electrodes 124 form a storing portion and the piezo-electric layer 112 and the conductive layer 114 form a transfer channel. In the storing portion, it is possible to make a potential deeper than the potential which restrains the charge carriers in the transfer channel 131. FIGS. 39D to 39F show the process of storing and transferring charge carriers 125 by changing the potential level in the storing portion 130. When the level of the potential in the storing portion 130 is deep, the charge carriers 125 are stored therein as shown in FIG. 39D. Then, by raising the level as shown in FIG. 39E, the charge carriers 125 are moved from the storing portion 130 to the transfer channel 131. Then, as shown in FIG. 39F, all the charge carriers 125 are moved to the transfer channel 131 and transferred through the transfer channel 131. The structure of the device may be as shown in FIG. 39G wherein the piezo-electric layer 112 is provided on the storing portion 124. In this case, since the light impinging upon the storing portion is absorbed by the piezo-electric layer 112, the sensitivity of the storing portion to the light is not so high, though the manufacture of the device is simple owing to the simple structure. The charge carriers 125 stored in the storing portion as shown in FIG. 39D may be the charge carriers which have been transferred through the transfer channel 131 and restrained by the storing portion 130 by the gradient of the potential between the transfer channel 131 and the storing portion 130 and by diffusion of the charge carriers per se by means of a later-mentioned memorizing means, or may be the charge carriers which are generated by a photo-electric conversion element located at the series of electrodes 124. As the photo-electric conversion element to be used for this purpose, various known elements which generate an electric signal upon receipt of light can be used. Particularly, p-n junction, Shottky junction and pin junction elements are preferred.

FIG. 40A shows another embodiment similar to the embodiment shown in FIG. 39A. FIG. 40B is a lateral sectional view of FIG. 40A. The embodiment shown in FIGS. 40A and 40B is different from the embodiment shown in FIGS. 39A to 39C in that the former is provided with storing gates 132 between the series of electrodes 124 and the transfer channel. As shown in FIGS. 40C and 40D, the storing and transfer of the charge carriers 125 are controlled by changing the level of the storing gate 132 between the storing portion 130 and the transfer channel 131. The change of the level of the storing gate 132 with respect to the levels of the adjacent portions 130 and 131 can be realized not only by changing the level of only the storing gate 132 but also by changing the levels of other portions too.

FIG. 41A shows another embodiment similar to the embodiment shown in FIG. 40A. The embodiment shown in FIG. 41A is characterized in that photo-electric conversion elements 133 are provided outside the storing portion 130 under the electrodes 124. The mechanism of storing and transferring charge carriers 125 is shown in FIGS. 41B and 41C. When the photo-electric conversion elements 133 are subjected to light exposure 134, charge carriers 125 are generated therein and the charge carriers 125 are stored in the storing portion 130 by potential gradient between the level of the potential at the photo-electric conversion elements 133 and the storing portion 130 and diffusion thereof. Then, by lowering or deepening the potential level of the storing gate 132 and raising the potential level of the storing portion 130, the charge carriers 125 are moved from the storing portion 130 to the transfer channel 131 by the potential gradient and diffusion of the charge carriers. This embodiment is advantageous in that the amount of light effecting upon the device can be easily controlled or enlarged by enlarging the size or selecting the position of the photo-electric conversion elements 133 and further the photo-electric conversion efficiency can be enhanced since the light is received directly by the photo-electric conversion elements 133 namely without the intervention of an electrode or the like. Consequently, a large amount of charge carriers can be used as a medium of signal or information.

In the above-described embodiments in which the storing portion is not provided in the transfer channel, the acoustic wave is hardly dispersed while it propagates through the piezo-electric layer 112 and accordingly the input power required at the acoustic wave generating means can be made small. Further, the position of the photo-electric conversion elements can freely be selected with respect to the position of the transfer channel. Further, when the charge carriers are transferred from the plurality of storing sections, it is possible to open the storing gates in a desired order. Therefore, it is possible to read out the stored information in a desired order regardless of the order of recording.

Figure 42A:
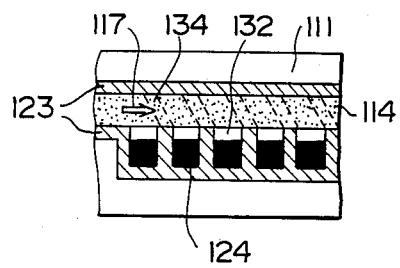
Figure 42B:
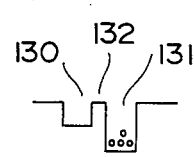
Figure 42C:
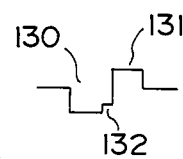
Figure 43:
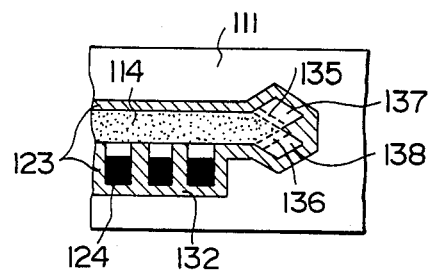
FIG. 43 is a plan view showing still another embodiment of the invention in which a charge carrier storing portion is provided close to the transfer channel.

Now it will be described how the charge carriers transferred in the transfer channel are injected into the storing portion in the charge transfer device in which the storing portion is provided outside the transfer channel with reference to FIGS. 42A to 42C. FIG. 42A shows an embodiment similar to that shown in FIG. 40A in which electrodes 134 for guiding the charge carriers transferred through the transfer channel 131 to the storing portion 130 are provided. The guiding electrodes 134 may be provided in such a position as shown in FIGS. 30A, 32 or 33, namely in the upper insulating layer 113 or on the lower insulating layer 111 in the piezo-electric layer 112. However, when the piezo-electric layer 112 allows, the position as shown in FIGS. 34, 35, 36 and so forth can be selected. The mechanism of transferring the stored charge carriers is the same as that explained hereinabove with reference to the embodiments shown in FIGS. 40C and 40D. When the charge carriers are transferred, the electrodes 134 are not applied with voltage for preventing transfer of the charge carriers. When the charge carriers are injected into the storing portion, the electrodes 134 are applied with a voltage and the potential in the region of the transfer channel 131 is lowered as shown in FIG. 42C to form a wall against the charge carriers transferred. As a result, the charge carriers stopped at the electrodes 134 are moved to the storing portion by the gradient of potential and diffusion of the carriers. In such a charge transfer device, it is possible to store the charge carriers in a desired storing sections by controlling the voltage of the guiding electrodes 134. Further, by controlling the voltage of the storing gates, it is possible to read out the information stored in the desired storing sections. It is also possible to perform nondestructive read-out by use of a floating gate. In other words, it is possible to use the device as a memory element. Furthermore, it is also possible to conduct an information processing of the signal from the storing portion by providing electrodes 135 and 136 on the transfer channel as shown in FIG. 43 and controlling the electrodes 135 and 136 by changing over the electrodes to make a change-over of read-out between detecting portions 137 and 138 provided for the electrodes 135 and 136.

Figure 44A:
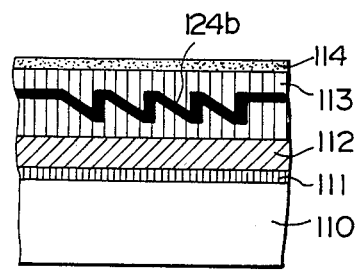
FIGS. 44A and 44B are cross-sectional and explanatory views showing still another embodiment of the invention having a charge carrier storing portion close to the transfer channel.
Figure 44B:
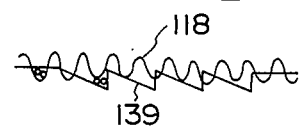

Another embodiment of the charge transfer device in accordance with the present invention is shown in FIG. 44A in cross-section. This device has a continuous electrode 124*b* within an insulating layer 113. When the electrode 124*b* and the conductive layer 114 are applied with a voltage, a potential wave 139 having high and low levels corresponding to the distance between the electrode 124*b* and the surface of the semiconductor 110 is formed in the vicinity of the surface of the semiconductor 110 as shown in FIG. 44B. By making the potential wells deeper than the potential wells of the wave 118 by applying a voltage thereto, it is possible to store the charge carriers in the wells. Further, the stored charge carriers can be transferred by controlling the voltage applied to the electrode 124*b*.

Now, another embodiment of the charge carrier transfer device in which the information read-out can be conducted at desired intervals will be described in detail with reference to FIGS. 45A-45C and 46A-46B.

Figure 45A:
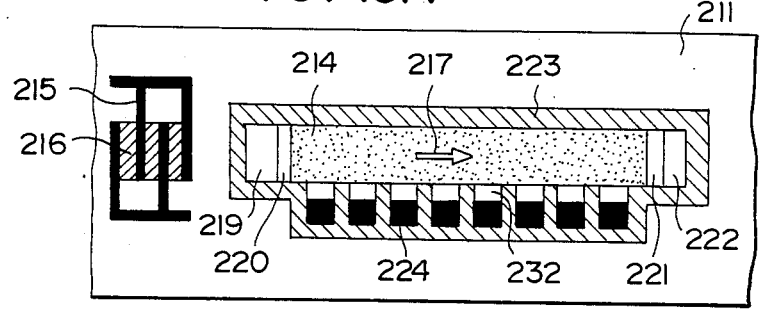
FIGS. 45A and 45B are plan and cross-sectional views of a further embodiment of the present invention having a charge carrier storing portion.
Figure 45B:
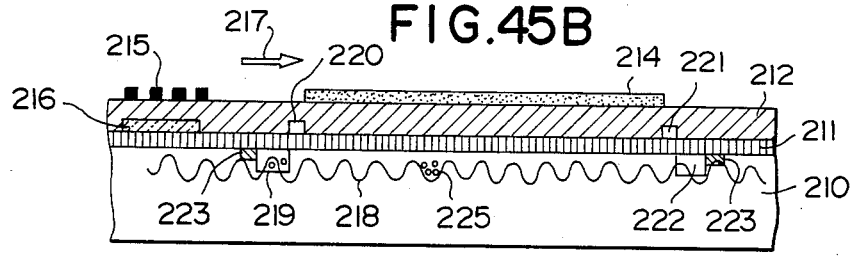
Figure 45C:
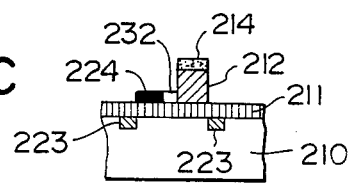
FIG. 45C is a side sectional view of the embodiment shown in FIGS. 45A and 45B.

The embodiment shown in FIGS. 45A to 45C is similar in cross-section to the embodiment shown in FIG. 16A and in plan view to the embodiment shown in FIG. 40A. On a semiconductor 210 is applied an insulating layer 211 and further thereon is applied a piezo-electric layer 212. A conductive layer 214 is provided on the pizeo-electric layer 212. An interdigital electrode 215 and a pad 216 are provided in the same manner as that employed in the embodiment shown in FIG. 16A. The reference numerals 217 and 218 are equivalent to the reference numerals 31 and 33, respectively, shown in FIG. 16A. The injection diode 219, injection gate 220, detection gate 221 and detection diode 222 are equivalent to the injection diode 119, injection gate 120, detection gate 121 and detection diode 122 shown in FIGS. 30A and 30B. In this embodiment, the channel stoppers 223 are provided in the semiconductor 210 whereas in the former embodiments as shown in FIGS. 16A, 30A the channel stoppers 24 and 123 are provided in the piezo-electric layer 27 and 112. A series of electrodes 224 similar to the electrodes 124 shown in FIG. 40A are provided beside the conductive layer 214 on the transfer channel and storing gates 232 are provided between the electrodes 224 and the piezo-electric layer 212 under the conductive layer 214 similarly to the embodiment shown in FIGS. 40A and 40B. The mechanism for transferring and storing the charge carriers 225 is the same as that of the embodiment shown in FIGS. 40A and 40B as shown in FIGS. 40C and 40D.

Figure 46A:
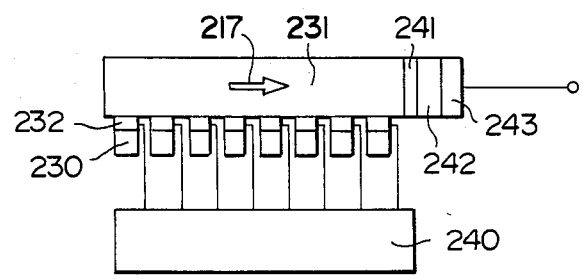
FIG. 46A is an explanatory view showing the method of read out of the stored information by use of a shift register.

The method of reading out the information stored in the charge transfer device of the above embodiment shown in FIGS. 45A to 45C will be described in detail with reference to FIGS. 46A and 46B. In FIG. 46A, a shift register 240 connected with the storing gates 232 is shown. The reference numerals 230 and 231 designate storing portions and transfer channel, respectively. At an end of the transfer channel 231, a carrier reservoir 241, an output gate 242 and an output diode 243 are connected in this order. The carrier reservoir 241 is a region where the transferred charge carriers are reserved by making the depth of the potential well larger than the depth of the potential of the acoustic wave by applying a voltage to the gate thereof. The output gate 242 is used for controlling the output level of the output of the carriers to the output diode 243.

Figure 46B:
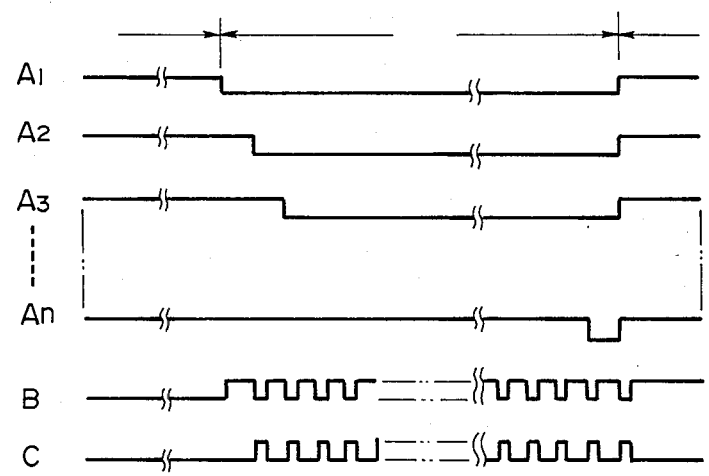
FIG. 46B is a timing chart showing the process of read out of information in the embodiment shown in FIGS. 45A, 45B and 46A.

FIG. 46B shows a timing chart which represents the control by the shift register 240. For example, the shift register 240 successively opens the storing gates 232 from the gate close to the output gate 242, i.e. in the order of $A_1, A_2, A_3, \ldots A_n$. In response to opening of the storing gates 242, the charge carriers are moved from the storing portion 230 to the transfer channel 231 successively through the open gates 242. The moved charge carriers are restrained in the potential wells of the potential wave 218 and accordingly are transferred in the direction of the arrow 217, and then they are reserved at the reservoir 241 temporarily as shown at the signal B. Then, by opening the output gate 242 at the stage where the transfer of the charge carriers from the storing portion 230 is finished, an output is given to external devices through the output diode 243 as shown at the signal C. In this case, if the external device is one that receives a signal in the television rate for instance, the intervals of output given by the output diode 243 is controlled to match the television rate. This can be done by operating the output gate 242 according to the processing speed of the external device. In order to realize this, the storing gates 232 are successively opened and closed so that the charge carriers from the respective storing sections of the storing portion 230 are stored temporarily in the carrier reservoir 241 in an integrated form. The timing of the opening and closing of the storing gates 232 is properly determined in view of the time intervals required by the external circuits or devices, the speed of propagation of the potential wave accompanying the acoustic wave and the distance between adjacent storing sections. Since the distances from the different storing sections to the carrier reservoir 241 are different, the interval of signals arriving the carrier reservoir 241 is a little changed if the storing gates are opened and closed at constant time intervals. However, the change in the interval of signals gives no problem in practice if the signals are integrated while the output gate is closed. In the embodiment as shown in FIG. 46A in which a shift register is employed, the output signals can be given at equal time intervals even if the spatial intervals of the storing sections are not equal, and the output signals can be given at changed time intervals even if the spatial intervals of the storing sections are not equal. This can be made by properly selecting the timing of the output gate 242 or storing gates 232 by use of the shift register 240. Further, since the charge carriers from one storing section are not restrained in one potential well of one wavelength but are restrained in a number of potential wells, the blooming is reduced and the dynamic range can be made large. Furthermore, since the signal is outputted after completely stored in the carrier reservoir 241, the signal processing is facilitated.

In the above embodiment, the carrier reservoir 241 is not always necessary. Further, the storing portion 230 may not be located beside the transfer channel 231 but may be located in the transfer channel. The storing portion 230 may or may not be provided with a photo-electric conversion function. For instance, a photo-electric conversion element is provided close to the storing portion 230 so that the charge carriers generated at the photo-electric conversion element are moved to the storing portion 230 by a potential gradient and diffusion of the carriers.

Though in the above-described embodiment shown in FIGS. 45A–45C and 46A the storing sections are arranged in one direction and accoringly the information memorized is of one dimension, it is possible to arrange the storing sections in two dimension. In the arrangement where the storing sections or photo-electric conversion elements are arranged in two dimension, the information recorded or stored is read out one line by one line into a series of signals continued sequentially. For instance, in an image pick-up device in which photo-electric conversion elements area arranged in two dimension in X and Y directions, the signal obtained by transfer of charge carriers in X-direction like the case of CCD image pick-up device is transferred in Y-direction one line by one line. In transferring the signal in Y-direction, the CCD can be used. However, the SAW-CTD can also be used for transferring the signal in Y-direction.

Figure 47:
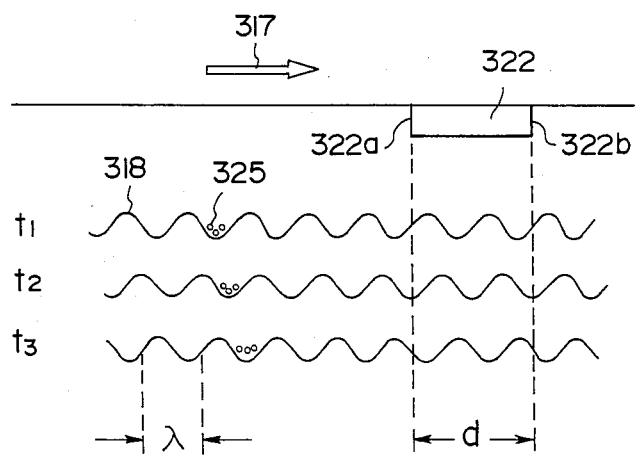
FIG. 47 is an explanatory view for showing the effect of the charge detecting means employed in a preferred embodiment of the present invention.

Now, the relationship between the length of the detection diode and the wavelength of the potential wave will be described referring to FIG. 47. In FIG. 47, the detection diode 322 has a length d measured in the direction of propagation of the potential wave 318 indicated by an arrow 317. In FIG. 47, the length d of the detection diode 322 is twice as long as the wavelength $\lambda$ of the potential wave 318, i.e. $d=2\lambda$. The length d is the distance between the front end 322a and the rear end 322b of the detection diode 322. In the embodiment as shown in FIG. 47, the piezo-electric potential integrated at the detection diode 322 at the time of $t_1$ is zero because at the time of $t_1$ just two waves are passing through the detection diode 322 as shown and the ratio of the crest to the trough of the wave 318 is just 1:1. At other times of $t_2$ and $t_3$, the integrated value of the potential is also zero for the same reason. Therefore, at the detection diode 322, only the charge carriers 325 are effectively detected all the time. On the other hand, when the length of the detection diode 322 is equal to 1.5$\lambda$ for instance, the piezo-electric potential does not become zero and is accordingly detected through the detection diode 322 as a noise to the signal based on the charge carriers transferred. The noise varies with a frequency corresponding to that of the potential wave 318. The noise based thereon is removed only when the length of the detection diode d is an integral number of times as long as the wavelength $\lambda$ of the potential wave 318. For instance, when the wavelength of the potential wave is 40μ, the output signal can be free of the noise by making the length of the detection diode 322 80μ. It should be noted, however, that the length of the detection diode 322 may not be exactly an integral number of times as long as the wavelength since in practical use the noise may not be perfectly zero. In more detail, the noise is practically desired to be reduced to about 20% or 10% of its maximum value that appears when the length of the detection diode 322 is an integral number $\pm\frac{1}{2}$ times as long as the wavelength. Such a reduction of the noise can be effected when the difference of the length of the detection diode 322 from the ideal length is about $$\frac{1}{15} \lambda \text{ or } \frac{1}{30} \lambda.$$

That is, when the wavelength is 40μ, the noise is reduced to 20% when $d=(80\pm2.7)\mu$ and to about 10% when $d=(80\pm1.3)\mu$.

As long as the length of the detection diode 322 is substantially an integral number of times as long as the wavelength of the potential wave 318 in the direction of propagation of the potential wave 318, the length of the detection diode 322 in the direction perpendicular to the propagation direction or the shape of the detection diode 322 can freely be selected as shown in FIGS. 48A to 48C for instance. In FIGS. 48A to 48C, the reference numeral 331 designates a transfer channel and 317 designates the direction of transfer of charge carriers. The detection diode 322 extends at right angle with respect to the direction of transfer in FIG. 48A, extends obliquely in FIG. 48B and extends in a curve in FIG. 48C.

In the above-described embodiment as shown in FIGS. 47 and 48A to 48C, the length of the detection diode 322 should not be made too large so that the signals from different storing sections can be separately detected.

Further, it will be understood by those skilled in the art that the noise can be reduced or eliminated without making the length of the detection diode an integral number of times as long as the wavelength of the potential wave if the output of the signal is integrated for a time period during which the potential wave advances through the detection diode by a length equal to an integral number of times as long as the wavelength of the potential wave.

Now, still another embodiment of the present invention will be described with reference to FIGS. 49 and 50 in which there are provided two acoustic wave generating means. FIG. 50 is a cross-sectional view taken along chain line C of FIG. 49. The cross-section of this embodiment is quite the same as that of the embodiment shown in FIG. 45B and the elements designated by the reference numerals 410 to 425 are equivalent to those designated by 310 to 325 in FIGS. 45A and 45B, and accordingly the detailed description thereof is omitted here. The mechanism of transferring and storing charge carriers is the same as that of the embodiment shown in FIGS. 45A and 45B. The structure of the charge carrier storing gates 432 and the transfer channel 431 is also the same as that of those shown in FIGS. 40A to 40D indicated at 132 and 131.

In the above described structure and in the various embodiments hereinbefore described, the charge carriers overflow from the potential wells when the device is subjected to light of high intensity or to light for a long time and flow into other potential wells located close thereto. In the embodiment shown in FIGS. 49 and 50, therefore, there is provided an additional acoustic wave generator for generating a second acoustic wave propagating in the direction of arrow 451 perpendicular to the direction of propagation of the first acoustic wave indicated by the arrow 417. The first acoustic wave 418 is generated by use of the interdigital electrode 415 located at one end of the plurality of transfer channels 431. The second acoustic wave is generated by use of another interdigital electrode 450 located in parallel to the transfer channels 431. By the second acoustic wave transferring in the direction of the arrow 451, the charge carriers overflowing from the storing portions 430 are bunched and transferred to the transfer channels 431 and there bunched by the first acoustic wave 418 to be transferred in the direction of the arrow 417 toward the detection diodes 422. Thus, the excess charge carriers which cannot be stored in the storing portions 430 are bunched by the second acoustic wave and moved to the transfer channels 431 before they get into the adjacent storing sections by overflow. Hence, the blooming phenomenon is prevented effectively.

In the above embodiment, the wavelength of the second acoustic wave can be freely selected without being limited by the wavelength of the first acoustic wave. The depth of the potential wells of the second acoustic wave is not required to be so large so long as it is enough to restrain the overflowing charge carriers. The direction of propagation of the second acoustic wave is required to be such that the overflowing charge carriers bunched thereby are prevented from flowing into adjacent storing sections but are moved to the transfer channels. Preferably, this direction is perpendicular to the direction of propagation of the first acoustic wave, but it is not limited thereto. Further, the direction of propagation of the second acoustic wave may be opposite to that shown in FIG. 49 only for the purpose of preventing the overflow of the charge carriers and preventing the blooming phenomenon.

We claim:

1. An image pick-up device comprising a charge transfer device of the monolithic type in which charge carriers are transferred bunched in first travelling potential wells of a potential wave accompanying an acoustic wave propagating therein where at least some of the charge carriers are generated by image-wise light exposure of the charge transfer device, said charge transfer device including acoustic wave generating means for propagating said acoustic wave in a piezoelectric layer, means for establishing a transfer channel for transferring therethrough the charge carriers, said channel comprising a depletion layer in the vicinity of the surface of a semiconductor where said piezoelectric layer and said semiconductor may comprise the same member, a detecting means for detecting the transferred charge carriers, and means for establishing a plurality of discrete charge carrier storage portions in or close to the transfer channel for storing at least some of the charge carriers generated by said image-wise light exposure of the charge transfer device, said latter means including (a) at least one electrode means disposed in proximity to said transfer channel and (b) potential applying means for applying at least one potential to said electrode means to establish a first plurality of stationary potential wells respectively corresponding to said plurality of discrete charge carrier storage portions where each of said stationary potential wells is stationary with respect to said transfer channel while said travelling potential wells move along said transfer channel, and means for changing the relationship between said stationary potential wells and said travelling potential wells between at least (a) a first relationship where the charge carriers are stored in said stationary potential wells and not transferred by said travelling potential wells and (b) a second relationship where the charge carriers are transferred from the stationary potential wells to the travelling potentials wells to be transferred along said transfer channel to said detecting means.

2. An image pick-up device comprising a charge transfer device of the monolithic type in which charge carriers are transferred bunched in first travelling potential wells of a potential wave accompanying an acoustic wave propagating therein where at least some of the charge carriers are generated by image-wise light exposure of the charge transfer device, said charge transfer device including acoustic wave generating means for propagating said acoustic wave in a piezoelectric layer, means for establishing a transfer channel for transferring therethrough the charge carriers, said channel comprising a depletion layer in the vicinity of the surface of a semiconductor where said piezoelectric layer and said semiconductor may comprise the same member, a detecting means for detecting the transferred charge carriers, a channel stopper means provided around the transfer channel for preventing the charge carriers from deviating from the transfer channel wherein said detecting means is a member including a diode disposed in the vicinity of the surface of the semiconductor for detecting charge carriers transferred through the transfer channel, and the length of said member measured in the direction of propagation of the acoustic wave along the transfer channel is substantially an integral number of times as long as the wavelength of the acoustic wave and means for establishing a plurality of discrete charge carrier storage portions in or close to the transfer channel for storing at least some of the charge carriers generated by said image-wise light exposure of the charge transfer device, said latter means including (a) at least one electrode means disposed in proximity to said transfer channel and (b) potential applying means for applying at least one potential to said electrode means to establish a first plurality of stationary potential wells respectively corresponding to said plurality of discrete charge carrier storage portions where each of said stationary potential wells is stationary with respect to said transfer channel while said travelling potential wells move along said transfer channel, and means for changing the relationship between said stationary potential wells and said travelling potential wells between at least (a) a first relationship where the charge carriers are stored in said stationary potential wells and not transferred by said travelling potential wells and (b) a second relationship where the charge carriers are transferred from the stationary potential wells to the travelling potential wells to be transferred along said transfer channel to said detecting means.

3. An image pick-up device as defined in claims 1 or 2 including means for propagating the acoustic wave a distance of at least one wavelength in a period of time less than the statistical time for the charge carriers to drop in the traps on the surface of the semiconductor.

4. An image pick-up device as defined in claim 1 further comprising a shift register connected with the charge carrier storing portion, whereby the charge carriers stored in the storing portion are moved from the storing portion to the transfer channel at a desired time interval.

5. An image pick-up device as defined in claim 1 further comprising a second acoustic wave generating means for generating a second acoustic wave propagating in the direction substantially perpendicular to the direction of propagation of said acoustic wave used for transferring the charge carriers through said transfer channel.

6. An image pick-up device as defined in claim 1 wherein said detecting means is a member including a diode disposed in the vicinity of the surface of the semiconductor for detecting charge carriers transferred through the transfer channel, and the length of said member measured in the direction of propagation of the acoustic wave along the transfer channel is substantially an integral number of times as long as the wavelength of the acoustic wave.

7. An image pick-up device as defined in claim 2 further comprising a shift register connected with the charge carrier storing portion, whereby the charge carriers stored in the storing portion are moved from the storing portion to the transfer channel at a desired time interval.

8. An image pick-up device as defined in claim 2 further comprising a second acoustic wave generating means for generating a second acoustic wave propagating in the direction substantially perpendicular to the direction of propagation of said acoustic wave used for transferring the charge carriers through said transfer channel.

9. An image pick-up device as in claim 1 including a channel stopper means provided around the transfer channel for preventing the charge carriers from deviating from the transfer channel.

10. An image pick-up device as in claims 1 or 2 where said plurality of charge storing portions are arranged in a line.

11. An image pick-up device as in claim 10 including a plurality of said transfer channels where said plurality of charge storing portions are arranged in a two-dimensional array.

12. An image pick-up device as in claims 1 or 2 where the potential applied to said electrode means is greater than the sum of (a) the potential employed to form said depletion layer and (b) the potential of said potential wave.

13. An image pick-up device as in claim 12 where said electrode means includes a plurality of discrete electrodes and said potential applying means includes means for respectively applying a plurality of potentials to said plurality of discrete electrodes for respectively establishing said plurality of stationary potential wells, said device including means for successively removing the said plurality of potentials applied to the said plurality of discrete electrodes in the direction opposite to the direction of propagation of the potential wave to thus successively remove said plurality of stationary potential wells so that the charge carriers stored in the stationary potential wells are transferred to said travelling wave to thus be transferred along said transfer channel.

14. An image pick-up device as in claims 1 or 2 where said means for establishing a plurality of discrete charge carrier storage portions includes a plurality of discrete electrodes disposed along a line substantially parallel to the transfer channel and means for respectively applying a plurality of potentials to said plurality of discrete electrodes to establish said first plurality of stationary potential wells.

15. An image pick-up device as in claim 14 where said plurality of stationary potential wells are respectively formed beneath said plurality of discrete electrodes.

16. An image pick-up device as in claim 14 where said plurality of stationary potential wells are respectively formed between said plurality of discrete electrodes.

17. An image pick-up device as in claims 1 or 2 where said charge carrier storage portions are formed in said transfer channel.

18. An image pick-up device as in claim 17 including an insulating layer disposed on said piezoelectric layer, said plurality of discrete electrodes being disposed in insulating layer.

19. An image pick-up device as in claim 18 including an electrode disposed on said insulating layer for forming said depletion region, said latter electrode being separated from said plurality of discrete electrodes by said insulating layer.

20. An image pick-up device as in claim 18 where said plurality of discrete electrodes are disposed on said piezoelectric layer.

21. An image pick-up device as in claim 18 where said plurality of discrete electrodes are spaced from said piezoelectric layer.

22. An image pick-up device as in claim 17 where said piezoelectric layer and said semiconductor are separate layers and said device includes an insulating layer disposed between the piezoelectric layer and the semiconductor, said plurality of discrete electrodes being disposed in said piezoelectric layer.

23. An image pick-up device as in claim 22 including an electrode disposed on said piezoelectric layer for forming said depletion region, said latter electrode being separated from said plurality of discrete electrodes by said insulating layer.

24. An image pick-up device as in claim 22 where said plurality of discrete electrodes are disposed on said insulating layer.

25. An image pick-up device as in claim 22 where said plurality of discrete electrodes are spaced from said insulating layer.

26. An image pick-up device as in claim 17 including an insulating layer disposed on said piezoelectric layer and where electrode means includes a continuous, undulating member disposed in said insulating member and means for applying a potential to said undulating member to form said first plurality of stationary potential wells.

27. An image pick-up device as in claims 1 or 2 where said piezoelectric layer and said semiconductor are separate layers and where said plurality of discrete electrodes are disposed in said piezoelectric layer and spaced from the semiconductor.

28. An image pick-up device as in claims 1 or 2 where said piezoelectric layer and said semiconductor are separate layers and said device includes a further semiconductor disposed between the piezoelectric layer and the semiconductor, said further semiconductor being doped such that the conductivity type thereof is the same as the polarity of the charge carriers.

29. An image pick-up device as in claims 1 or 2 where said piezoelectric layer and said semiconductor are separate layers and where said depletion layer is formed by ions implanted in said device adjacent said transfer channel, the polarity of said ions being the opposite that of said charge carriers.

30. An image pick-up device as in claim 29 where said ions are implanted in said piezoelectric layer.

31. An image pick-up device as in claim 29 including an insulating layer disposed between the piezoelectric layer and the semiconductor, said ions being implanted in the semiconductor layer.

32. An image pick-up device as in claims 1 or 2 where said semiconductor and said piezoelectric layer comprise the same member.

33. An image pick-up device as in claim 32 including an insulating layer disposed between said member and said plurality of discrete electrodes.

34. An image pick-up device as in claim 33 where said depletion layer is formed by ions implanted in said insulating layer, the polarity of said ions being opposite to that of said charge carriers.

35. An image pick-up device as in claims 1 or 2 where said charge carrier storage portions are formed close to the transfer channel.

36. An image pick-up device as in claim 35 where said piezoelectric layer and said semiconductor are separate layers and said device includes an insulating layer disposed between the semiconductor and the piezoelectric layer, said plurality of discrete electrodes being disposed on said insulating layer such that said stationary charge carrier portions are disposed close to said transfer channel.

37. An image pick-up device as in claim 36 where said piezoelectric layer is disposed on said plurality of discrete electrodes.

38. An image pick-up device as in claim 36 where said piezoelectric layer has at least one substantially vertically extending side wall and said plurality of discrete electrodes are disposed close to said one side wall.

39. An image pick-up device as in claim 38 including a plurality of storing gates respectively disposed between said plurality of discrete electrodes and said one side wall of the piezoelectric layer and means for applying a further plurality of electrical potentials to said plurality of storing gates such that a further plurality of stationary potential wells are respectively provided between said first plurality of stationary potential wells and said transfer channel, said further plurality of stationary potential wells also being stationary with respect to said transfer channel, the relationships between said first stationary potential wells, said further stationary potential wells and said travelling potential wells being such that charge carriers stored in said first stationary potential wells in response to said image-wise exposure are subsequently respectively transferred to at least one of the travelling potential wells in response to a predetermined change in at least one of the potentials of the travelling potential wells or the potentials applied to said plurality of discrete electrodes or said plurality of storing gates.

40. An image pick-up device as in claim 39 including means for respectively changing the plurality of potentials applied to said storing gates by at least a predetermined amount to effect said transfer of the charge carriers stored in said first stationary potential wells to the travelling wave.

41. An image pick up device as in claim 39 where said plurality of discrete electrodes respectively have at least first sides respectively facing said plurality of storing gates and respective second sides disposed at the sides of the discrete electrodes opposite the first sides and where said image pick-up device includes a plurality of photo-electric conversion elements respectively disposed close to said second sides of the plurality of discrete electrodes such that at least some of said charge carriers are generated by said photo-electric conversion elements and transferred to said first stationary potential wells upon said image-wise exposure of the charge transfer device.

42. An image pick-up device as in claim 39 including a shift register having a plurality of stages where each stage has an output and means for respectively connecting the outputs of the shift register to said plurality of storing gates and means for controlling said shift register to effect said transfer of the charge carriers to the transfer channel.

43. An image pick-up device as in claim 42 where said transfer channel has an output end and said means for controlling the shift register includes means for successively opening and closing said storage gates starting with the gate closest to said output end of the transfer channel so that the charge carriers stored in said first stationary potential wells are successively transferred to the travelling potential wells.

44. An image pick-up device as in claim 43 including a charge carrier reservoir and an output gate disposed in series at the end of the transfer channel with the charge carrier reservoir being closer to the end of the channel and means for controlling said charge carrier reservoir and said output gate so that the charge carriers from one of said first stationary potential wells are stored and integrated in said charge carrier reservoir and then outputted through said output gate prior to the arrival of the charge carriers from the stationary potential well accessed immediately subsequent to said one potential well.

45. An image pick-up device as in claim 39 including means for generating further travelling potential wells at an angle with respect to said first travelling potential wells to transfer charge carriers from said first stationary potential wells to said transfer channel to thus substantially inhibit overflow of charge carriers from at least certain ones of said first stationary potential wells to adjacent first stationary potential wells when a localized portion of the image pick-up device is over exposed to said image-wise light.

46. An image pick-up device as in claim 45 where said means for generating further travelling potential wells includes means for generating the further travelling potential wells in a direction substantially perpendicular to the first travelling potential wells.

47. An image pick-up device as in claims 1 or 2 including a shift register having a plurality of stages where each stage has an output and means for controlling the shift register including means for controlling the transfer of charge carriers from said first stationary potential wells to said transfer channel where said outputs of said shift register are respectively associated with said first stationary potential wells.

48. An image pick-up device as in claim 47 where said means for controlling the shift register includes means for successively accessing the stationary potential wells so that the charge carriers stored in said first stationary potential wells are successively transferred to the travelling potential wells.

49. An image pick-up device as in claim 48 including a charge carrier reservoir and an output gate disposed in series at the end of the transfer channel with the charge carrier reservoir being closer to the end of the channel and means for controlling said charge carrier reservoir and said output gate so that the charge carriers from one of said first stationary potential wells are stored and integrated in said charge carrier reservoir and then they are outputted through said output gate prior to the arrival of the charge carrier from the stationary potential well accessed immediately subsequent to said one potential well.

50. An image pick-up device as in claim 1 including a detection diode disposed at the output end of the transfer channel for receiving charge carrier, the dimension of said diode in the direction of propagation of the travelling potential wave being substantially an integral number of times as long as the wavelength of one of the potential waves.

51. An image pick-up device as in claims 8 or 50 where the length dimension of said diode extends transverse to the direction of propagation of the travelling potential wave.

52. An image pick-up device as in claim 51 where said length dimension is perpendicular to said propagation direction.

53. An image pick-up device as in claim 51 where said length dimension is oblique to said propagation direction.

54. An image pick-up device as in claim 51 where said diode is curved.

55. An image pick-up device as in claims 1 or 2 including means for generating further travelling potential wells at an angle with respect to said first travelling potential wells to transfer charge carriers from said first stationary potential wells to said transfer channel to thus substantially inhibit overflow of charge carriers from at least certain ones of said first stationary potential wells to adjacent first stationary potential wells when a localized portion of the image pick-up device is over-exposed to said image-wise light.

* * * * *